(12) United States Patent
Arai et al.

(10) Patent No.: US 6,661,231 B1
(45) Date of Patent: Dec. 9, 2003

(54) BATTERY CAPACITY CALCULATING METHOD AND DEVICE THEREFOR

(75) Inventors: Youichi Arai, Shizuoka (JP); Tsutomu Saigo, Shizuoka (JP); Hideaki Kamohara, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 216 days.

(21) Appl. No.: 09/856,467
(22) PCT Filed: Oct. 6, 2000
(86) PCT No.: PCT/JP00/06993
§ 371 (c)(1),
(2), (4) Date: Oct. 9, 2001
(87) PCT Pub. No.: WO01/27646
PCT Pub. Date: Apr. 19, 2001

(30) Foreign Application Priority Data

| Oct. 8, 1999 | (JP) | 11-288661 |
| Oct. 8, 1999 | (JP) | 11-288768 |
| Oct. 4, 2000 | (JP) | 2000-304736 |
| Oct. 4, 2000 | (JP) | 2000-304737 |

(51) Int. Cl.$^7$ .............................................. G01N 27/416
(52) U.S. Cl. ......................................... 324/426; 320/132
(58) Field of Search ................................. 324/426, 427, 324/430, 433; 320/132, 149; 340/635, 636; 429/61, 90

(56) References Cited

U.S. PATENT DOCUMENTS

| 4,394,741 A | 7/1983 | Lowndes | 364/483 |
| 5,652,069 A | 7/1997 | Sakai et al. | 429/92 |

FOREIGN PATENT DOCUMENTS

| EP | 0 447 928 A1 | 9/1991 |
| JP | 4-341769 | 11/1992 |
| JP | 10-319100 | 12/1998 |
| JP | 2000-134705 | 5/2000 |
| JP | 2000-134706 | 5/2000 |

OTHER PUBLICATIONS

Copy of European Patent Office Communication including European Search Report for corresponding European Patent Application 00964726 dated Mar. 15, 2002.

Primary Examiner—Edward H. Tso
(74) Attorney, Agent, or Firm—Armstrong, Westerman & Hattori, LLP

(57) ABSTRACT

A method and apparatus are provided, by which a state of charge of a battery is accurately computed without being influenced by the polarization effect. An estimated voltage of the battery 13 in a constant load discharge with a predetermined large current value is estimated from a voltage-current characteristic when the discharge current of the constant load discharging process by the battery 13 that is in an equilibrium state is decreasing from the predetermined large current value corresponding to a maximum supplying electric power to the load. A difference between the estimated voltage and an open circuit voltage, which estimates the estimated voltage and is a terminal voltage of the battery 13 that is in an equilibrium state before the start of the constant load discharge by using the predetermined large current value, is calculated. Then, the difference is memorized by first memory means 27 for memorizing a residual voltage drop defining as the residual voltage drop due to a residual polarization at the end of the discharging process of the battery 13. The residual voltage drop memorized by the first memory means 27 is added to the estimated voltage of the battery 13, thereby a present charging capacity of the battery 13 is computed.

18 Claims, 12 Drawing Sheets

$V_n = aI_n + b$

I-V CHARACTERISTIC

CONSTANT CURRENT DISCHARGE CHARACTERISTIC

IMAGINARY CONSTANT CURRENT DISCHARGE CHARACTERISTIC

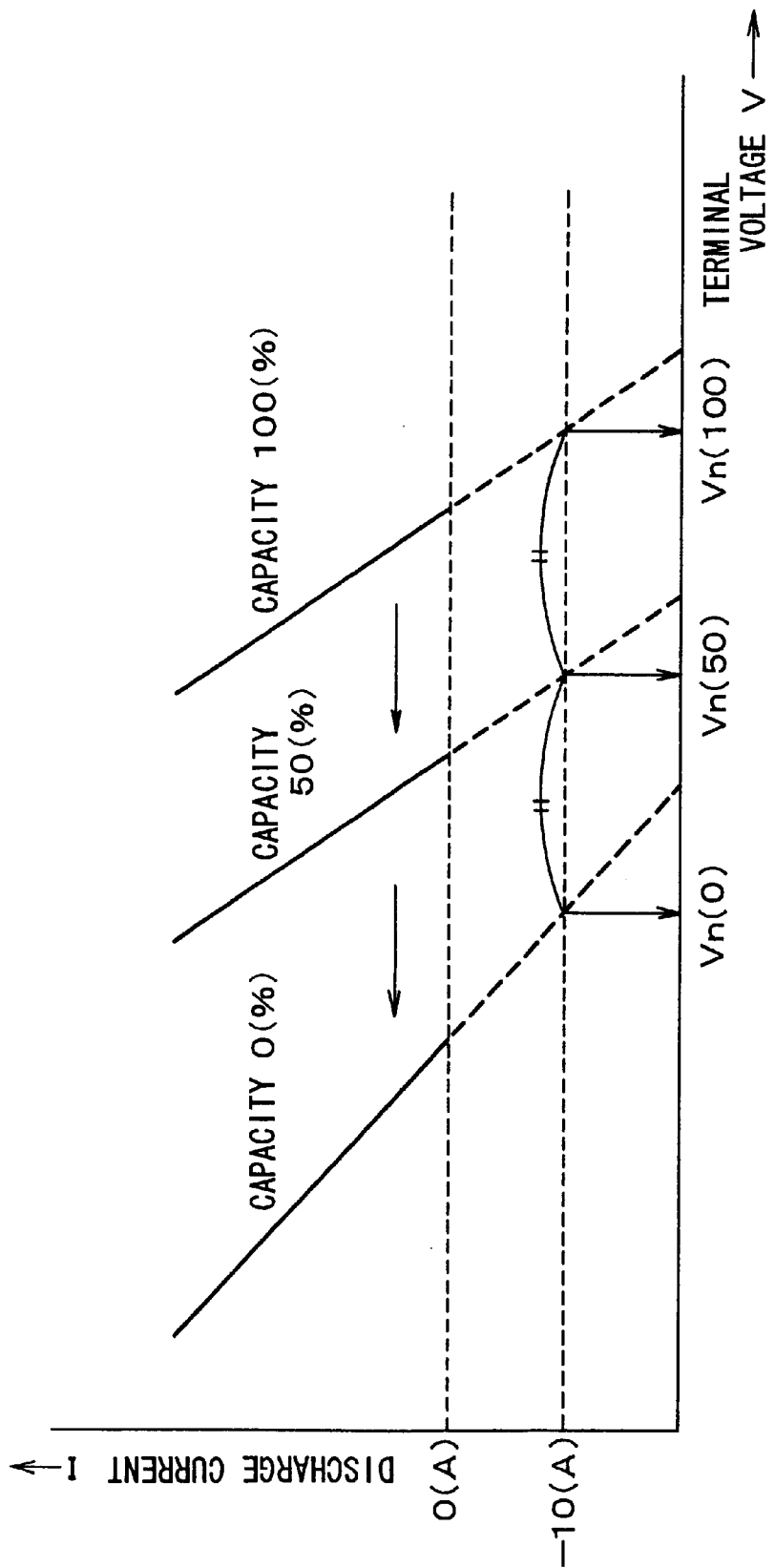

BATTERY CAPACITY CALCULATING METHOD AND DEVICE THEREFOR

TECHNICAL FIELD

The present invention relates to a method for computing a charging capacity of a battery, which supplies the electric power to loads in a vehicle, and an apparatus for use in such method. More specifically, the present invention relates to a method and an apparatus for computing a charging capacity of a battery, in which a voltage-current characteristic derived from a periodically measured terminal voltage and discharge current of the battery is used to estimate an estimated voltage that is an estimated terminal voltage of the battery in its state of constant-load discharge, thereby the charging capacity of the battery is computed from the estimated voltage.

BACKGROUND ART

So far, a driving source of a vehicle has been mainly an engine, in which gasoline or gas oil is employed as the fuel, but in recent years a vehicle employing an electromotive motor, which does not directly discharge the combustion gas, as the only or the supplementary driving source has appeared. As to a vehicle loading the electromotive motor, grasping a charging capacity of a battery, which supplies the electric power to the electromotive motor, is important for computing a possible traveling distance and so on.

So far, an integration method of current or electric power has been employed, in which an integrated consumed electric power computed by using an integrated value of the discharge current is subtracted from a full charging capacity so as to compute the present charging capacity. However, in such a method, an original full charging capacity is changed depending upon individual differences among batteries, deterioration rates of the batteries and so on, therefore the present charging capacity of the battery cannot be accurately computed.

A state of charge of the battery can be known by measuring the density of the electrolyte of the battery since there is a certain linear relationship between the density of the electrolyte and the state of charge. However, actually in a battery during charging or discharging and a battery right after the completion of charge or discharge thereof, chemical reactions occurring between the electrolyte and the electrodes make the density of the electrolyte non-uniform, therefore the state of charge of the battery cannot be known accurately by measuring the density of the electrolyte.

Besides, the charging capacity of the battery may be known by measuring the terminal voltage of the battery. But the terminal voltage is not stable unless the discharge current is stabilized, therefore actually the terminal voltage correlating with the state of charge of the battery cannot be obtained by the measurement.

As shown in characteristic graphs in FIG. 11, in which the battery is subjected to the discharge with each constant current ranging from 10 to 80 A in units of 10 A, the discharging time (horizontal axis) increases with decreasing the discharge current while the terminal voltage (vertical axis) of the battery drastically decreases with the discharging time.

Here, the horizontal axis of the characteristic graphs in FIG. 11 is the time, however, since the discharge is carried out with the constant current and the battery capacity is expressed by electrical quantity (Ah), this horizontal axis can be regarded as the battery capacity.

Then, the characteristic graphs in FIG. 11 reveals that smaller the discharge current, higher the electric power to be obtained and that the capacity drop near the state of full charge of the battery is slow while the capacity drop near the state of full discharge is rapid.

As described above, even if the discharge current can be stabilized, since there is no linear correlation between the charging capacity of the battery and the terminal voltage thereof, the charging capacity cannot be derived from the terminal voltage of the battery.

Thus, appears to be reasonable is a method for computing the capacity employing a relationship between the state of charge of the battery and the open circuit voltage, which is possibly a linear relationship since there is about a linear relation between the electrolyte density of the battery and the open circuit voltage and since there is a linear relation between the electrolyte density of the battery and the state of charge of the battery.

However, the sole weak point of this method for computing the capacity is that the open circuit voltage can be measured during non-discharging period of time when the state of charge of the battery does not change, except the self-discharging. In other words, the open circuit voltage cannot be measured during discharging when the state of charge of the battery changes.

Consequently, a point of the above method for computing the capacity is how to find out the open circuit voltage during the discharge of the battery.

The terminal voltage and the discharge current can be measured during the discharge of the battery. As shown in FIG. 11, since the terminal voltage appears to decrease with increasing the discharge current even when the state of charge of the battery does not change, there is a voltage-current characteristic (I-V characteristic) showing a negative correlation between the terminal voltage and the discharge current, which changes with changing the state of charge of the battery.

Thus, in order to know a plurality of the voltage-current characteristics of the battery in response to the state of charge of the battery, the following measurement is carried out.

First, a discharge is continuously carried out by using an impulse current, in which a current $I_a$ and a current $I_b$ smaller than $I_a$ are periodically mutually appear, and then the predetermined number of the sets (for example, 100 sets) of the terminal voltage having a reverse phase with respect to the discharge current and the discharge current, i.e. $(I_a, V_1)$, $(I_b, V_2)$, $(I_a, V_3)$, $(I_b, V_4)$,—are continuously sampled at the same period of time with the impulse cycle (for example, 1 millisecond) of the discharge current.

Then, from thus sampled sets of the terminal voltage and the discharge current, i.e. $(I_a, V_{01})$, $(I_b, V_{02})$, $(I_a, V_{03})$, $(I_b, V_{04})$,—, by using the method of least squares, coefficients $a_1$ and $b_1$ in an equation $V=a_1I+b_1$, i.e. a linear relationship between the voltage and current of the battery are obtained, wherein the equation $V=a_1I+b_1$ is placed as the voltage-current characteristic of the battery corresponding to the capacity during the above sampling.

Then, the similar discharge to the discharge described above is continuously carried out by using an impulse current, in which currents $I_a$ and $I_a$ are periodically mutually appear, and then the predetermined number of the sets of the terminal voltage having a reverse phase with respect to the discharge current and the discharge current, i.e. $(I_a, V_{11})$, $(I_b, V_{12})$, $(I_a, V_{13})$, $(I_b, V_{14})$,—are continuously sampled. Then, from thus sampled sets of the terminal voltage and the discharge current, by using the method of least squares, coefficients $a_2$ and $b_2$ in an equation $V=a_2I+b_2$, i.e. a linear relationship between the voltage and current of the battery are obtained, wherein the equation $V=a_2I+b_2$ is placed as the voltage-current characteristic of the battery corresponding to the capacity during the above sampling.

Thereafter, similarly, coefficients an and bn in an equation $V=a_2I+b_2$, i.e. a linear relationship between the voltage and current of the battery are obtained, wherein the equation $V=a_2I+b_2$ is placed as the voltage-current characteristic of the battery corresponding to each mutually different capacity which gradually decreases, thereby the voltage-current characteristics of the battery corresponding to the respective capacities ranging from 100% to 0%.

In FIG. 12, there is schematically shown a relation between the sampled sets of the terminal voltage and the discharge current. i.e. $(I_a\ V_{n1})$, $(I_b,\ V_{a2})$, $(I_a,\ V_{n3})$, $(I_b, V_{n4})$,—and the linear voltage-current equation $V=a_nI+b_n$, which is obtained from the sets by using the method of least squares.

Here, an imaginary current value Is that is an imaginary constant current value is substituted to the voltage-current characteristic equation of the battery corresponding to the respective capacities, then if the resultant obtained V is defined as an estimated voltage Vn that is an estimated terminal voltage of the battery in its state of constant-load discharge, a constant current discharging characteristic shown in graphs in FIG. 13 is obtained.

When any positive value is substituted for the imaginary current value Is, the corresponding constant current discharging characteristic becomes a non-linear characteristic, in which the estimated terminal voltage Vn rapidly decreases as the capacity of the horizontal axis increases in the vicinity of the right end of the respective curves, and even in the case of the imaginary current value Is=0 A, in which the open circuit voltage must be theoretically shown, the constant current discharging characteristic shows a similar characteristic.

According to the graphs in FIG. 13, since smaller the imaginary current value Is, smaller the degree of decreasing in the estimated voltage Vn as the capacity reduces to zero, therefore when a negative value is substituted as the imaginary current value Is to the voltage-current characteristic equation of the battery corresponding to the respective capacities, the resultant constant current discharging characteristic is expressed by curves shown in FIG. 14. In this case, the characteristic of the estimated voltage Vn in the vicinity of the capacity being zero shows an inflectional change having a boundary of the imaginary current value Is=−10 A.

Consequently, theoretically if the imaginary current value Is is set −10 A, the estimated voltage Vn in the constant current discharge shows a linear relationship with respect to the capacity of the battery.

FIG. 15 shows graphs illustrating the voltage-current characteristic of the battery corresponding to the respective capacities with having the vertical axis of the discharge current I and the horizontal axis of the terminal voltage V. In the following, that the estimated voltage Vn during the constant current discharging has a linear relationship with respect to the battery capacity will be verified.

Since coefficients $a_1$, $a_2$,—, $a_n$, expressing the respective gradients of the voltage-current characteristic equations are mutually different and coefficients $b_1$, $b_2$—, $b_n$ expressing the respective intercepts of the voltage-current characteristic equations also are mutually different, in the region of positive discharge current that actually exists, no value I of discharge current, at which the terminal voltage V linearly changes with the change in the battery capacity, exists.

To the contrary, in the region of negative discharge current that is an imaginary region shown in FIG. 15, the terminal voltage V shows a characteristic of changing linearly with respect to the battery capacity, that is, the terminal voltage V of the battery corresponding to each capacity at the discharge current value I=−10 A is the estimated voltage Vn.

A graph in FIG. 16 shows a relationship between the battery capacity at the imaginary current value Is=−10 A and the estimated voltage Vn that has a linear correlation with the battery capacity. As shown in FIG. 16, the estimated voltage Vn exists between the open circuit voltage Vs at the fully charged state and the open circuit voltage Ve at the end of discharge, therefore a capacity value corresponding to the estimated voltage Vn is a residual capacity, i.e. a state of charge (SOC).

Consequently, since the estimated voltage takes the place of the open circuit voltage of the battery, even upon discharge when the open circuit voltage cannot be measured, provided that the discharge is a constant load discharge, in which the load supplying the electric power does not change during discharge, the terminal voltage that changes delicately during discharge and the discharge current are measured, thereby the voltage-current characteristic that is a relation between the terminal voltage and the discharge current during the constant load discharge is known. Then, the imaginary current value Is=−10 A is substituted into the resultant characteristic equation (V=aI+b) so as to know the estimated voltage Vn, thereby the a state of charge (SOC) of the battery can be calculated from the estimated voltage Vn.

The present state of charge (SOC) with respect to the fully charged capacity can be calculated from the graph shown in FIG. 16 as follows:

$$SOC = \{(Vn-Ve)/(Vs-Ve)\} \times 100 (\%).$$

More accurately, the present state of charge (SOC) with respect to the fully charged capacity can be calculated as follows in terms of a ratio of the electric power (V×Ah):

$$SOC = \{[(Vn+Ve)/2] \times [(Vn-Ve)/(Vs-Ve)] \times Ah\}/$$
$$\{[Vs+Ve)/2] \times Ah\} \times 100\ (\%)$$
$$= \{(Vn^2 - Ve^2)/Vs^2 - Ve^2)\} \times 100\ (\%).$$

Generally, as shown in FIG. 17, during the discharge of a battery, a voltage drop due to a pure resistance (ohmic resistance of the battery) such as IR drop (=the pure resistance×discharge current) and a voltage drop due to a polarization at the discharging side takes place, on the other hand during the charge of the battery, a voltage rise due to the pure resistance such as voltage rise due to a polarization at the charging side takes place.

Especially as shown in FIG. 17, an activation polarization for advancing redox reactions on the surface of the electrodes, which is included in the polarization at the discharging side arising during the discharge of the battery, and a concentration polarization due to the difference in concentrations of the reactants and products generated from a result of the mass transfer between the electrode surfaces and the solution, take place with some delay with respect to the increase and decrease in the discharge current, therefore these polarizations do not show a linear relationship with the value of the discharge current.

Consequently, when the estimated voltage Vn is to be caluculated instead of the open circuit voltage in order to compute the state of charge (SOC) of the battery, the terminal voltage and the discharge current are measured during the discharge so as to caluculate the voltage-current characteristic. However, since the terminal voltage includes the voltage drop due to the polarization during the discharge, the caluculated voltage-current characteristic and the estimated voltage Vn caluculated therefrom include the voltage drop due to the polarization besides the state of charge (SOC) of the battery, therefore the estimated voltage Vn as it is cannot employed to calculate accurately the state of charge (SOC) of the battery.

DISCLOSURE OF INVENTION

It is therefore an objective of the present invention to solve the above problem and to provide a method for computing a battery capacity, in which an estimated voltage, which is an estimated terminal voltage of the battery in its state of constant-load discharge and is calculated from a correlation between the terminal voltage and the discharge current that are measurable during the discharge, is employed to compute the state of charge of the battery, thereby the the state of charge of the battery can be accurately computed even if the terminal voltage of the battery, which is used to calculate the estimated voltage, does not completely cancel out the factors of voltage rise or drop due to the former charge or discharge. The present invention also provides an apparatus for use in such method.

Method for Computing Battery Capacity According to the First Aspect of the Present Invention A first aspect of the present invention is a method for computing a battery capacity comprising the steps of:
periodically measuring a terminal voltage and a discharge current of a battery that supplies an electric power to loads in a vehicle;
calculating a voltage-current characteristic expressing a correlation between the terminal voltage and the discharge current;
estimating an estimated voltage that is an estimated terminal voltage of the battery in a constant load discharging state thereof from the voltage-current characteristic; and
computing a charging capacity of the battery from the estimated voltage,
wherein a value of the estimated voltage of the battery in the constant load discharge with a predetermined large current value is estimated from the voltage-current characteristic when the discharge current of the constant load discharging process by the battery that is in an equilibrium state is decreasing from the predetermined large current value corresponding to a maximum supplying electric power value to the loads,
a difference value between the value of the estimated voltage and a value of an open circuit voltage, which estimates the value of the estimated voltage and is a terminal voltage of the battery that is in an equilibrium state before the start of the constant load discharge by using the predetermined large current value, is calculated in advance as a value of a residual voltage drop due to a residual polarization at the end of the discharge process of the battery,
thereafter, whenever the battery is subjected to the constant load discharge by using the predetermined large current value, the voltage-current characteristic is calculated from the terminal voltage and the discharge current of the battery, which are periodically measured during the constant load discharge by using the predetermined large current value,
a present estimated voltage of the battery is estimated from the voltage-current characteristic, and
the value of the residual voltage drop is added to a value of the present estimated voltage of the battery, thereby a present charging capacity of the battery is computed.

According to the method for computing a battery capacity of the first aspect of the present invention, once the discharge current of the constant load discharge reaches the predetermined large current value corresponding to the maximum supply electric power value to the loads of the vehicle, even if the voltage drop or rise due to the polarization at the charge or discharge side arisen in the former discharge remains before the start of the discharge, the system is in a state that the polarization of the discharge side corresponding to the predetermined large current value, which exceeds the residual voltage drop, arises or in a state that the polarization of the discharge side, the magnitude of which corresponds to the predetermined large current value, newly arises after the residual voltage rise is canceled off.

On the other hand, even if the battery in an equilibrium state is subjected to the constant load discharge with the predetermined large current value, when the discharge current reaches the predetermined large current value, the polarization arises, the magnitude of which corresponds to the predetermined large current value.

Therefore, when the battery is subjected to the constant load discharge with the predetermined large current value, not depending upon that the battery was in an equilibrium state before the start of the constant load discharge or that the polarized state at the discharge or charge side arisen in the former discharge is not quite completely canceled off, the estimated voltage estimated from the voltage-current characteristic, which is calculated from the discharge current and the terminal voltage of the battery while the discharge current is decreasing from the predetermined large current value, is the same.

Not depending upon whether or not the battery was in an equilibrium state before the start of the constant load discharge with the predetermined large current value, the value of the estimated voltage estimated after the start of the constant load discharge is lower than the open circuit voltage, corresponding to the terminal voltage of the battery in the equilibrium state when supposing that the battery before the start of the constant load discharge was in the equilibrium state, by the residual voltage drop value, which is in advance calculated as the value of the residual voltage drop due to the residual polarization at the end of the constant load discharge carried out by the battery with the predetermined large current value.

Preferably, regarding the method according to the first aspect of the present invention, a value of the terminal voltage of the battery in an equilibrium state is measured in advance so as to set up the measured value as a value of the open circuit voltage,
then, the voltage-current characteristic is calculated from the terminal voltage and the discharge current of the battery, which are periodically measured when the discharge current of the constant load discharging process is decreasing from the predetermined large current value when the buttery in an equilibrium state is subjected to the constant load discharge by using the predetermined large current value, then, the estimated voltage of the battery upon the constant load discharge by using the predetermined large current value starting from the equilibrium state is estimated from the voltage-current characteristic, and then, a value of the estimated voltage of the battery upon the constant load discharge by using the predetermined large current value starting from the equilibrium state is subtracted from the value of the set open circuit voltage, thereby the value of the residual voltage drop is calculated in advance.

According to the method for computing a battery capacity of the first aspect of the present invention, when the battery in the equilibrium state implements the constant load discharge with the predetermined large current value, the terminal voltage of the battery is measured before the start of the constant load discharge so as to set up the value of the open circuit voltage, then when the discharge current of the constant load discharge decreases from the predetermined large current value, the estimated voltage is estimated on the basis of the voltage-current characteristic calculated from the periodically measured terminal voltage and discharge current of the battery, thereby the difference between the estimated voltage and the value of the open circuit voltage set up beforehand is calculated as the value of the residual voltage drop, thereafter the difference is added to the present estimated voltage of the battery, which is estimated each time the battery is subjected to the constant load discharge, this addition being implemented in order to compute the present charging capacity of the battery.

Preferably, regarding the method according to the first aspect of the present invention, whenever the battery reaches an equilibrium state, the value of the open circuit voltage is newly replaced by a value of the terminal voltage of the battery, which is measured in the equilibrium state.

According to the method for computing a battery capacity of the first aspect of the present invention, the open circuit voltage changing in response to the change in the state of charge due to the discharge is replaced by the newest value of the terminal voltage each time the battery is in an equilibrium state.

Preferably, regarding the method according to the first aspect of the present invention, whenever the battery is subjected to the constant load discharge by using the predetermined large current value, the voltage-current characteristic is calculated from the terminal voltage and the discharge current of the battery, which are periodically measured when the discharge current of the constant load discharging process by using the predetermined large current value is decreasing from the predetermined large current value, thereby the present estimated voltage of the battery is estimated from the voltage-current characteristic.

According to the method for computing a battery capacity of the first aspect of the present invention, whenever the battery is subjected to the constant load discharge by using the predetermined large current value, the voltage-current characteristic is calculated from the terminal voltage and the discharge current of the battery, which are periodically measured when the discharge current of the constant load discharging process by using the predetermined large current value is decreasing from the predetermined large current value, thereby the present estimated voltage of the battery is estimated from the voltage-current characteristic and the present state of charge of the battery is computed from the values of the estimated voltage and the residual voltage drop.

Preferably, regarding the method according to the first aspect of the present invention, the predetermined large current value is set to be a current value required upon starting a starter motor of the vehicle, and the voltage-current characteristic is calculated from the terminal voltage and the discharge current, which are periodically measured while the value of the discharge current decreases to a target current value that is smaller than the predetermined large current value and not less than a maximum discharge current value when loads of the vehicle except the starter motor are driven, after the value of the discharge current starts to decrease from the predetermined large current value.

According to the method for computing a battery capacity of the first aspect of the present invention, even if the electric power from the battery is simultaneously supplied to a plurality of the other loads of the vehicle, the current value required upon the start of the starter motor exceeds the current value thereof, therefore when the current value required upon the start of the starter motor is set up to be the predetermined large current value, the terminal voltage is subjected to the voltage drop exceeding the voltage drop due to the polarization of the discharge side arisen due to the former discharge when the discharge current reaches the predetermined large current.

On the other hand, when the discharge current decreases from the predetermined large current value to the target current value not less than the maximum discharge current value upon the driving of the loads except the starter motor, the voltage drop due to the polarization of the discharge side remaining in the terminal voltage of the battery in that state does not seemingly contain the voltage drop component due to the polarization of the discharge side arisen due to the power supply to the loads of the vehicle except the starter motor, therefore only the remaining component after excluding the component of the voltage drop due to the polarization of the discharge side caused by the discharge with the predetermined large current value, which is canceled out due to the decrease in the discharge current to the target current value, seemingly appears.

Consequently, when the voltage-current characteristic is calculated from the terminal voltage and discharge current periodically measured until the discharge current of the battery, which carries out the constant load discharge with the predetermined large current value, decreases from the predetermined large current value to the target current value, the estimated voltage estimated from the the voltage-current characteristic purely reflects only the remaining component after excluding the component of the voltage drop due to the polarization of the discharge side caused by the discharge with the predetermined large current value, which is canceled out due to the decrease in the discharge current to the target current value, even if the loads of the vehicle except the starter motor is still driven.

Preferably, regarding the method according to the first aspect of the present invention, whenever the estimated voltage of the battery is estimated upon the constant load discharge by using the predetermined large current value, the value of the residual voltage drop is revised in response to a circumferential temperature of the battery upon the estimation of the estimated voltage and a circumferential temperature of the battery upon the calculation of the open circuit voltage, and the present charging capacity of the battery is computed from the revised value of the residual voltage drop.

According to the method for computing a battery capacity of the first aspect of the present invention, when the temperature around the battery changes, the battery capacity also changes to change the terminal voltage of the battery, therefore if the temperature around the battery is different between at a time when the open circuit voltage of the battery in an equilibrium is calculated and at a time when the estimated voltage of the battery is estimated during the constant load discharge by using the predetermined large current value, the terminal voltage component reflected in the open circuit voltage in response to the temperature around the battery is different from the terminal voltage component reflected in the estimated voltage in response to the temperature around the battery.

However, if the present charging capacity of the battery is computed by using the revised value of the residual voltage drop, which is revised in response to the temperature around the battery when the open circuit voltage of the battery in an equilibrium is calculated and the temperature around the battery when the estimated voltage of the battery is estimated during the constant load discharge by using the predetermined large current value, the present state of charge of the battery is computed in a state that the changeable component of the terminal voltage changeable due to the difference in the temperature around the battery is removed, by using the open circuit voltage and estimated voltage, in which the terminal voltage component in response to the temperature around the battery is reflected in the same condition.

Method for Computing Battery Capacity According to the Second Aspect of the Present Invention A second aspect of the present invention is a method for computing a battery capacity comprising the steps of:
  periodically measuring a terminal voltage and a discharge current of a battery that supplies an electric power to loads in a vehicle;
  calculating a voltage-current characteristic expressing a correlation between the terminal voltage and the discharge current;
  estimating an estimated voltage that is an estimated terminal voltage of the battery in a constant load discharging state thereof from the voltage-current characteristic; and
  computing a charging capacity of the battery from the estimated voltage,
    wherein whenever the battery is subjected to the constant load discharge by using the predetermined large current value corresponding to a maximum supplying electric power value to the loads, the voltage-current characteristic is calculated from the terminal voltage and the discharge current of the battery, which are periodically measured when the discharge current of the constant load discharging process by using the predetermined large current value is decreasing from the predetermined large current value, thereby the present estimated voltage Vn of the battery is estimated from the voltage-current characteristic.

According to the method for computing a battery capacity of the second aspect of the present invention, once the discharge current of the constant load discharge reaches the predetermined large current value corresponding to the maximum supplying electric power value to the loads of the vehicle, even if the voltage drop or rise due to the polarization at the charge or discharge side arisen in the former discharge remains before the start of the discharge, the system is in a state that the polarization of the discharge side corresponding to the predetermined large current value, which exceeds the residual voltage drop, arises or in a state that the polarization of the discharge side, the magnitude of which corresponds to the predetermined large current value, newly arises after the residual voltage rise is canceled off.

On the other hand, even if the battery in an equilibrium state is subjected to the constant load discharge with the predetermined large current value, when the discharge current reaches the predetermined large current value, the polarization arises, the magnitude of which corresponds to the predetermined large current value.

Therefore, when the battery is subjected to the constant load discharge with the predetermined large current value, not depending upon that the battery was in an equilibrium state before the start of the constant load discharge or that the polarized state at the discharge or charge side arisen in the former discharge is not quite completely canceled off, the estimated voltage estimated from the voltage-current characteristic, which is calculated from the discharge current and the terminal voltage of the battery while the discharge current is decreasing from the predetermined large current value, is the same.

When the battery implements the constant load discharge with the predetermined large current, even if the voltage drop or rise due to the polarization at the charge or discharge side arisen in the former discharge remains before the start of the discharge, the voltage-current characteristic is calculated from the terminal voltage and the discharge current of the battery, which are periodically measured until the discharge current value decreases from the predetermined large current value under the condition that the influence of the residual voltage drop or rise is removed, then this voltage-current characteristic, in which the influence of the polarization arisen in the former discharge is removed, is used to estimate the present estimated voltage of the battery, thereby the state of charge of the battery is computed.

Preferably, regarding the method according to the second aspect of the present invention, the predetermined large current value is set to be a current value required upon starting a starter motor of the vehicle.

According to the method for computing a battery capacity of the second aspect of the present invention, even if the electric power from the battery is simultaneously supplied to a plurality of the other loads of the vehicle, the current value required upon the start of the starter motor exceeds the current value thereof, therefore when the current value required upon the start of the starter motor is set up to be the predetermined large current value, the terminal voltage is subjected to the voltage drop exceeding the voltage drop due to the polarization of the discharge side arisen due to the former discharge when the discharge current reaches the predetermined large current.

Preferably, regarding the method according to the second aspect of the present invention, the voltage-current characteristic is calculated from the terminal voltage and the discharge current, which are periodically measured while the value of the discharge current decreases to a target current value that is smaller than the predetermined large current value and not less than a maximum discharge current value when loads of the vehicle except the starter motor are driven.

According to the method for computing a battery capacity of the second aspect of the present invention, when the discharge current decreases from the predetermined large current value to the target current value not less than the maximum discharge current value upon the driving of the loads except the starter motor, the voltage drop due to the polarization of the discharge side remaining in the terminal voltage of the battery in that state does not seemingly contain the voltage drop component due to the polarization of the discharge side arisen due to the power supply to the loads of the vehicle except the starter motor, therefore only the remaining component after excluding the component of the voltage drop due to the polarization of the discharge side caused by the discharge with the predetermined large current value, which is canceled out due to the decrease in the discharge current to the target current value, seemingly appears.

Consequently, when the voltage-current characteristic is calculated from the terminal voltage and discharge current periodically measured until the discharge current of the battery, which carries out the constant load discharge with the predetermined large current value, decreases from the predetermined large current value to the target current value, the estimated voltage estimated from the the voltage-current characteristic purely reflects only the remaining component after excluding the component of the voltage drop due to the polarization of the discharge side caused by the discharge with the predetermined large current value, which is canceled out due to the decrease in the discharge current to the target current value, even if the loads of the vehicle except the starter motor is still driven.

Apparatus for Computing Battery Capacity According to the First Aspect of the Present Invention As shown in FIG. 1, the first aspect of the present invention is also an apparatus for computing a battery capacity executing the steps of:

periodically measuring a terminal voltage and a discharge current of a battery 13 that supplies an electric power to loads in a vehicle when the battery 13 is subjected to a constant load discharge by using a predetermined large current value corresponding to a maximum supplying electric power value to the loads;

calculating a voltage-current characteristic expressing a correlation between the terminal voltage and the discharge current;

estimating an estimated voltage that is an estimated terminal voltage of the battery 13 in a constant load discharging state thereof from the voltage-current characteristic; and computing a charging capacity of the battery 13 from the estimated voltage, wherein the apparatus comprises first memory means 27 for memorizing a difference value as a value of a residual voltage drop due to a residual polarization at the end of the discharge process of the battery 13, said difference value being a difference value between a value of the estimated voltage and a value of an open circuit voltage, in which the value of the estimated voltage of the battery 13 in the constant load discharge with a predetermined large current value is estimated from the voltage-current characteristic when the discharge current of the constant load discharging process by the battery 13 that is in an equilibrium state is decreasing from the predetermined large current value, and the open circuit voltage estimates the value of the estimated voltage and is a terminal voltage of the battery 13 that is in an equilibrium state before the start of the constant load discharge by using the predetermined large current value, and wherein the value of the residual voltage drop memorized by the first memory means 27 is added to the value of the estimated voltage of the battery 13, thereby a present charging capacity of the battery 13 is computed.

According to the apparatus for computing a battery capacity of the first aspect of the present invention, once the discharge current of the constant load discharge reaches the predetermined large current value corresponding to the maximum supply electric power value to the loads of the vehicle, even if the voltage drop or rise due to the polarization at the charge or discharge side arisen in the former discharge remains before the start of the discharge, the system is in a state that the polarization of the discharge side corresponding to the predetermined large current value, which exceeds the residual voltage drop, arises or in a state that the polarization of the discharge side, the magnitude of which corresponds to the predetermined large current value, newly arises after the residual voltage rise is canceled off.

On the other hand, even if the battery 13 in an equilibrium state is subjected to the constant load discharge with the predetermined large current value, when the discharge current reaches the predetermined large current value, the polarization arises, the magnitude of which corresponds to the predetermined large current value.

Therefore, when the battery 13 is subjected to the constant load discharge with the predetermined large current value, not depending upon that the battery 13 was in an equilibrium state before the start of the constant load discharge or that the polarized state at the discharge or charge side arisen in the former discharge is not quite completely canceled off, the estimated voltage estimated from the voltage-current characteristic, which is calculated from the discharge current and the terminal voltage of the battery 13 while the discharge current is decreasing from the predetermined large current value, is the same.

Not depending upon whether or not the battery 13 was in an equilibrium state before the start of the constant load discharge with the predetermined large current value, the value of the estimated voltage estimated after the start of the constant load discharge is lower than the open circuit voltage, corresponding to the terminal voltage of the battery 13 in the equilibrium state when supposing that the battery 13 before the start of the constant load discharge was in the equilibrium state, by the residual voltage drop value, which is in advance calculated as the value of the residual voltage drop due to the residual polarization at the end of the constant load discharge carried out by the battery 13 with the predetermined large current value.

Preferably, regarding the apparatus according to the first aspect of the present invention, the apparatus further comprises:

first detecting means A for detecting a start of a decrease in the discharge current from the predetermined large current value in the constant load discharge process of the battery 13 by using the predetermined large current value;

first calculating means 23A for calculating the voltage-current characteristic from the periodically measured terminal voltage and the discharge current of the battery 13 after the first detecting means A detects the start of the decrease in the discharge current; and estimating means 23B for estimating the estimated voltage of the battery 13 in the constant load discharge process of the battery 13 by using the predetermined large current value, on the basis of the voltage-current characteristic calculated by the first calculating means 23A, wherein the value of the residual voltage drop memorized by the first memory means 27 is added to a value of the estimated voltage of the battery 13 estimated by the estimating means 23B, thereby a present charging capacity of the battery is computed.

According to the apparatus for computing a battery capacity of the first aspect of the present invention, when the battery 13 implements the constant load discharge with the predetermined large current value, each time the first detecting means A detects a start of a decrease in the discharge current of the battery 13 from the predetermined large current value, the first calculating means 23A calculates the voltage-current characteristic from the periodically measured terminal voltage and the discharge current of the battery 13, which are periodically measured while the discharge current decreases from the predetermined large current value, then the estimating means estimates the estimated voltage of the battery 13 in the constant load discharge process of the battery by using the predetermined large current value, on the basis of the voltage-current characteristic calculated by the first calculating means 23A, the present state of charge of the battery 13 is computed from the value of the residual voltage drop memorized by the first memory means 27 and the value of the estimated voltage estimated by the estimating means 23B.

Preferably, regarding the apparatus according to the first aspect of the present invention, the apparatus further comprises:

second memory means 25 for memorizing the value of the open circuit voltage;

judging means 23C for judging whether the battery is in an equilibrium state or not; and second calculating means 23D for calculating the value of the residual voltage drop by subtracting the estimated voltage estimated by the estimating means 23B from the value of the open circuit voltage memorized by the second memory means 25 in the constant load discharge process of the battery, which is judged to be in an equilibrium state by the judging means 23C, by using the predetermined large current value, wherein the first memory means 27 memorizes the value of the residual voltage drop calculated by the second calculating means 23D.

According to the apparatus for computing a battery capacity of the first aspect of the present invention, when the battery 13, which is judged to be in an equilibrium state by the judging means 23C, implements the constant load discharge with the predetermined large current value, after the first detecting means A detects that the charge current of the battery 13 decreases from the predetermined large current value, the second calculating means 23D calculates the value of the residual voltage drop by subtracting the estimated voltage estimated by the estimating means 23B from the value of the open circuit voltage memorized by the second memory means 25, then the first memory means 27 memorizes the value of the residual voltage drop calculated by the second calculating means 23D.

Preferably, regarding the apparatus according to the first aspect of the present invention, the apparatus further comprises:

measuring means B for measuring the terminal voltage of the battery 13, which is judged to be in an equilibrium state by the judging means 23C; and replacing means 23E for replacing the value of the open circuit voltage memorized by the second memory means 25 with a value of the terminal voltage of the battery 13 measured by the measuring means B.

According to the apparatus for computing a battery capacity of the first aspect of the present invention, even if the open circuit voltage of the battery 13 changes in response to the change in the state of charge due to the discharge, each time the battery 13 is judged to be in an equilibrium state by the judging means 23C, the value of the open circuit voltage memorized by the second memory means 25 is replaced with the newest value of the terminal voltage of the battery 13 measured by the measuring means B.

Preferably, regarding the apparatus according to the first aspect of the present invention, the apparatus further comprises:

second detecting means 19 for detecting a circumferential temperature of the battery 13; and revising means 23F for revising the value of the residual voltage drop memorized by the first memory means 27 in response to the circumferential temperature of the battery 13 detected by the second detecting means 19 when the estimating means 23B estimates the estimated voltage of the battery 13 and the circumferential temperature of the battery 13 detected by the second detecting means 19 when the measuring means B measures the terminal voltage of the battery 13, wherein the revised value of the residual voltage drop revised by the revising means 23F is added to the value of the estimated voltage of the battery 13 estimated by the estimating means 23B, thereby a present charging capacity of the battery 13 is computed.

According to the apparatus for computing a battery capacity of the first aspect of the present invention, when the temperature around the battery 13 changes, the battery capacity also changes to change the terminal voltage of the battery 13, therefore if the temperature around the battery 13 is different between at a time when the open circuit voltage of the battery 13 memorized in the second memory means 25 is calculated and at a time when the estimated voltage of the battery 13 is estimated by the estimating means 23B after the first detecting means A detects that the discharge current of the battery 13 judged to be in the equilibrium state by the judging means 23C starts decreasing from the predetermined large current value, the terminal voltage component reflected in the open circuit voltage in response to the temperature around the battery 13 is different from the terminal voltage component reflected in the estimated voltage in response to the temperature around the battery 13.

However, even if the temperature around the battery 13 detected by the second detecting means 19 at a time when the open circuit voltage memorized in the second memory means 25 is calculated is different from the temperature around the battery 13 detected by the second detecting means 19 at a time when the estimated voltage of the battery 13 is estimated by the estimating means 23B after the first detecting means A detects that the discharge current of the battery 13 judged to be in the equilibrium state by the judging means 23C starts decreasing from the predetermined large current value, the value of the residual voltage drop memorized by the first memory means 27 is revised in response to both temperatures around the battery 13 described above by the revising means 23F so as to compute the present charging capacity of the battery 13 by using the revised value of the residual voltage drop, thereby the present charging capacity of the battery 13 is computed in a state that the changeable component of the terminal voltage changeable due to the difference in the temperature around the battery is removed, by using the open circuit voltage and estimated voltage, in which the terminal voltage component in response to the temperature around the battery is reflected in the same condition.

Preferably, regarding the apparatus according to the first aspect of the present invention, the predetermined large current value is a current value required upon a start of a starter motor of the vehicle, the apparatus further comprises third detecting means C for detecting that the discharge current of the battery 13, which is detected by the first detecting means A as to start decreasing from the predetermined large current value, decreases to a target current value not less than a maximum discharge current value when loads of the vehicle except a starter motor are driven, wherein after the first detecting means A detects that the discharge current of the battery 13 starts to decrease from the predetermined large current value, the first calculating means 23A calculates the voltage-current characteristic from the periodically measured terminal voltage and the discharge current of the battery 13 until the third detecting means C detects that the discharge current of the battery 13 decreases to the target current value.

According to the apparatus for computing a battery capacity of the first aspect of the present invention, even if the electric power from the battery 13 is simultaneously supplied to a plurality of the other loads of the vehicle, the current value required upon the start of the starter motor 5 exceeds the current value thereof, therefore if the current value required upon the start of the starter motor 5 is set up to be the predetermined large current value, at a time when the first detecting means A detects that the discharge current of the battery 13 during the constant load discharge starts decreasing from the predetermined large current value, before that time the discharge current once reaches the predetermined large current and the terminal voltage of the battery 13 is subjected to the voltage drop exceeding the voltage drop due to the polarization of the discharge side arisen due to the former discharge.

At a time when the third detecting means C detects that the discharge current decreases from the predetermined large current value to the target current value not less than the maximum discharge current value upon the driving of the loads except the starter motor 5, the voltage drop due to the polarization of the discharge side remaining in the terminal voltage of the battery 13 in that state does not seemingly contain the voltage drop component due to the polarization of the discharge side arisen due to the power supply to the loads of the vehicle except the starter motor 5, therefore only the remaining component after excluding the component of the voltage drop due to the polarization of the discharge side caused by the discharge with the predetermined large current value, which is canceled out due to the decrease in the discharge current to the target current value, seemingly appears.

Consequently, the first calculating means 23A calculates the voltage-current characteristic of the battery 13 from the terminal voltage and discharge current, which are periodically measured after the first detecting means A detects that the discharge current of the battery 13 starts decreasing from the predetermined large current value until the third detecting means C detects that the discharge current of the battery 13 decreases to the target current value. The estimated voltage estimated by the estimating means 23B from the voltage-current characteristic purely reflects only the remaining component after excluding the component of the voltage drop due to the polarization of the discharge side caused by the discharge with the predetermined large current value, which is canceled out due to the decrease in the discharge current to the target current value, even if the loads of the vehicle except the starter motor 5 is still driven.

Apparatus for Computing Battery Capacity According to the Second Aspect of the Present Invention The second aspect of the present invention is also an apparatus for computing a battery capacity executing the steps of:

periodically measuring a terminal voltage and a discharge current of a battery 13 that supplies an electric power to loads in a vehicle when the battery 13 is subjected to a constant load discharge by using a predetermined large current value corresponding to a maximum supplying electric power value to the loads;

calculating a voltage-current characteristic expressing a correlation between the terminal voltage and the discharge current;

estimating an estimated voltage that is an estimated terminal voltage of the battery 13 in a constant load discharging state thereof from the voltage-current characteristic; and computing a charging capacity of the battery 13 from the estimated voltage, wherein the apparatus comprises:

first detecting means A for detecting a start of a decrease in the discharge current from the predetermined large current value in the constant load discharge process of the battery 13 by using the predetermined large current value;

first calculating means 23A for calculating the voltage-current characteristic from the periodically measured terminal voltage and the discharge current of the battery 13 after the first detecting means A detects the start of the decrease in the discharge current; and estimating means 23B for estimating the estimated voltage of the battery 13 in the constant load discharge process of the battery 13 by using the predetermined large current value, on the basis of the voltage-current characteristic calculated by the first calculating means 23A, thereby the charging capacity of the battery 13 is computed by using the estimated voltage of the battery 13 estimated by the estimating means 23B.

According to the apparatus for computing a battery capacity of the second aspect of the present invention, once the discharge current of the constant load discharge reaches the predetermined large current value corresponding to the maximum supply electric power value to the loads of the vehicle, even if the voltage drop or rise due to the polarization at the charge or discharge side arisen in the former discharge remains before the start of the discharge, the system is in a state that the polarization of the discharge side corresponding to the predetermined large current value, which exceeds the residual voltage drop, arises or in a state that the polarization of the discharge side, the magnitude of which corresponds to the predetermined large current value, newly arises after the residual voltage rise is canceled off.

On the other hand, even if the battery 13 in an equilibrium state is subjected to the constant load discharge with the predetermined large current value, when the discharge current reaches the predetermined large current value, the polarization arises, the magnitude of which corresponds to the predetermined large current value.

Therefore, when the battery 13 is subjected to the constant load discharge with the predetermined large current value, not depending upon that the battery 13 was in an equilibrium state before the start of the constant load discharge or that the polarized state at the discharge or charge side arisen in the former discharge is not quite completely canceled off, the estimated voltage estimated from the voltage-current characteristic, which is calculated from the discharge current and the terminal voltage of the battery 13 while the discharge current is decreasing from the predetermined large current value, is the same.

When the battery 13 implements the constant load discharge with the predetermined large current value, each time the first detecting means A detects a start of a decrease in the discharge current of the battery 13 from the predetermined large current value, the first calculating means 23A calculates the voltage-current characteristic from the periodically measured terminal voltage and the discharge current of the battery 13, which are periodically measured while the discharge current decreases from the predetermined large current value and measured under the condition that the influence of the residual voltage drop or rise is removed even if the voltage drop or rise due to the polarization at the charge or discharge side arisen in the former discharge remains before the start of the discharge, then the estimating means 23B estimates the estimated voltage of the battery 13 in the constant load discharge process of the battery with the predetermined large current value, on the basis of the voltage-current characteristic calculated by the first calculating means 23A with removing the influence of the polarization arisen in the former discharge, thereby the present state of charge of the battery 13 is computed from the value of the estimated voltage estimated by the estimating means 23B.

Preferably, regarding the apparatus according to the second aspect of the present invention, the predetermined large current value is a current value required upon a start of a starter motor of the vehicle.

According to the apparatus for computing a battery capacity of the second aspect of the present invention, even if the electric power from the battery 13 is simultaneously supplied to a plurality of the other loads of the vehicle, the current value required upon the start of the starter motor exceeds the current value thereof, therefore if the current value required upon the start of the starter motor is set up to be the predetermined large current value, at a time when the first detecting means A detects that the discharge current of the battery 13 upon the constant load discharge starts decreasing from the predetermined large current value, before that time the discharge current once reaches the predetermined large current and the battery 13 is in a state that the polarization of the discharge side, which is large enough for canceling the polarization arisen due to the former charge and discharge, arises.

Preferably, regarding the apparatus according to the second aspect of the present invention, the apparatus further comprises
third detecting means C for detecting that the discharge current of the battery 13, for which the first detecting means A detects that the discharge current starts decreasing from the predetermined large current value, decreases to a target current value not less than a maximum discharge current value when loads of the vehicle except a starter motor are driven,
wherein after the first detecting means A detects that the discharge current of the battery 13 starts to decrease from the predetermined large current value, the first calculating means 23A calculates the voltage-current characteristic from the periodically measured terminal voltage and the discharge current of the battery 13 until the third detecting means C detects that the discharge current of the battery 13 decreases to the target current value.

According to the apparatus for computing a battery capacity of the second aspect of the present invention, at a time when the third detecting means C detects that the discharge current decreases from the predetermined large current value to the target current value not less than the maximum discharge current value upon the driving of the loads except the starter motor 5, the voltage drop due to the polarization of the discharge side remaining in the terminal voltage of the battery 13 in that state does not seemingly contain the voltage drop component due to the polarization of the discharge side arisen due to the power supply to the loads of the vehicle except the starter motor 5, therefore only the remaining component after excluding the component of the voltage drop due to the polarization of the discharge side caused by the discharge with the predetermined large current value, which is canceled out due to the decrease in the discharge current to the target current value, seemingly appears.

Consequently, the first calculating means 23A calculates the voltage-current characteristic of the battery 13 from the terminal voltage and discharge current, which are periodically measured after the first detecting means A detects that the discharge current of the battery 13 starts decreasing from the predetermined large current value until the third detecting means C detects that the discharge current of the battery 13 decreases to the target current value. The estimated voltage estimated by the estimating means 23B from the voltage-current characteristic purely reflects only the remaining component after excluding the component of the voltage drop due to the polarization of the discharge side caused by the discharge with the predetermined large current value, which is canceled out due to the decrease in the discharge current to the target current value, even if the loads of the vehicle except the starter motor 5 is still driven.

BRIEF DESCRIPTION OF THE DRAWINGS

FIG. 15 shows graphs drawn in the same plane illustrating each voltage-current characteristic of the battery corresponding to the respective capacities;

BEST MODE FOR CARRYING OUT THE INVENTION

Constitution of Apparatus for Computing Battery Capacity According to the Preferred Embodiment of the Present Invention In the following, a method and an apparatus for computing a battery capacity according to the present invention will be explained with reference to the attached drawings.

Figure 1:
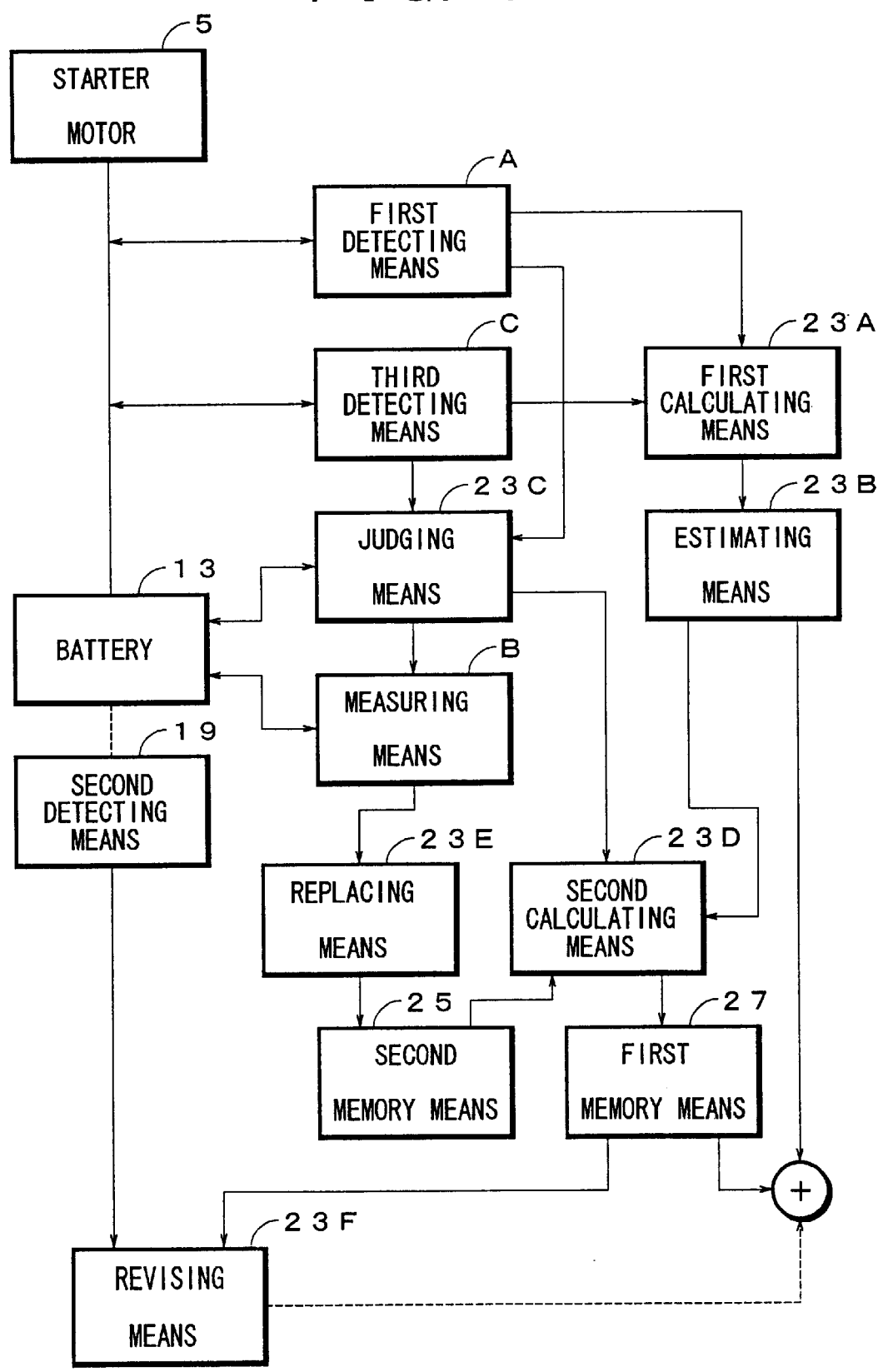
FIG. 1 is a basic constitution of an apparatus for computing a battery capacity according to the present invention.
Figure 2:
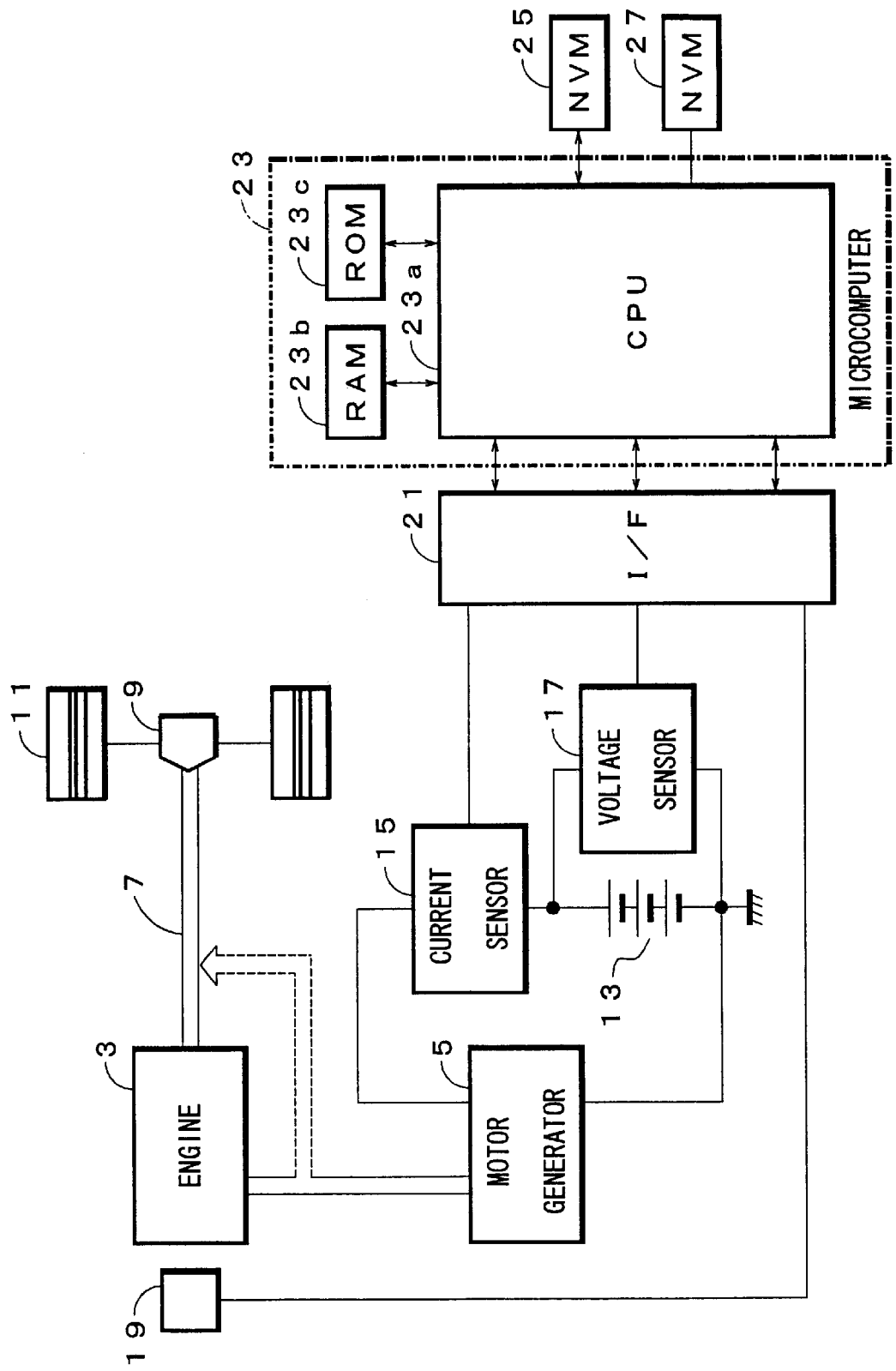
FIG. 2 is a block diagram illustrating a partial outline of an apparatus for computing a battery capacity according to an embodiment of the present invention, to which a method for computing a battery capacity according to the present invention is applied.

FIG. 2 is a block diagram illustrating a partial outline of an apparatus for computing a battery capacity according to an embodiment of the present invention, to which a method for computing a battery capacity according to the present invention is applied, in which the apparatus 1 for computing a battery capacity according to this embodiment is loaded on a hybrid vehicle having an engine 3 and a motor generator 5.

Normally, only an output of the engine 3 is transmitted from a drive shaft 7 to wheels 11 via differential case 9 so as to drive the vehicle, on the other hand, upon traveling with high load, the motor generator 5 functions as a motor by an electric power from a battery 13 so that an output of the motor generator 5 together with the output of the engine 3 is transmitted from the drive shaft 7 to the wheels 11, thereby an assistant driving is carried out.

In this hybrid vehicle, the motor generator 5 functions as a generator upon the decelerating or braking so as to convert the kinetic energy to the electric energy, thereby the battery 13 is charged.

Further, the motor generator 5 is used as a starter motor, which forcibly rotates a flywheel of the engine 3, upon the start of the engine 3 in response to the switching on of a starter switch (not shown in the figure). In this case, the motor generator 5 independently consumes higher electric power than that a plurality of the other electromotive loads that are loaded on the hybrid vehicle consume at the same time.

In this connection, although the starter switch is off in the hybrid vehicle of this preferred embodiment, since switches (not shown in the figure) of electrical equipments (loads) such as accessory switches and an ignition switch except the motor generator are on, when an air conditioner, audio equipment, power window, headlamp, interior lamp (not shown in the figure) and so forth are in operation, the discharge current flowing from the battery 13 is less than 35 A (ampere) even if a plurality of these electrical equipments are simultaneously in operation.

On the other hand, when the motor generator 5 is operated as the starter motor in order to start the engine 3 after the accessory switch is switched on followed by switching on the starter switch, the discharge current as high as 250 A instantaneously flows from the battery 13 even if none of the other electrical equipment is in operation.

Consequently, in the apparatus 1 for computing a battery capacity of this preferred embodiment, whether the discharge current of the battery 13 is between the target current value=35 A (the lower limit) and the maximum current value=250 A (the upper limit) or not is a criterion for judging whether the constant load discharge for operating the motor generator 5 as a starter motor is implemented or not.

In this connection, when the engine 3 is started by the motor generator 5 after the starter switch is switched on, in response to the cancel of the operation of the ignition key (not shown in the figure), the starter switch is turned off, thereby the ignition switch and the accessory switches are switched on.

The apparatus 1 for computing a battery capacity of this preferred embodiment computes the state of charge of the battery 13 and comprises: a current sensor 15 for detecting the charge current of the battery 13 flowing from the motor generator 5 functioning as a generator and the discharge current I of the battery 13 flowing to the electrical equipments such as the motor for the assistant driving and the motor generator 5 functioning as a starter motor; a voltage sensor 17 having a infinite resistance connected in parallel to the battery for detecting the terminal voltage V of the battery 13; and a temperature sensor 19 (corresponding to the second detecting means) for detecting the temperature h in an engine room (not shown in the figure) in which the engine 13 is disposed.

The apparatus 1 for computing a battery capacity of this preferred embodiment further comprises: a microcomputer 23 in which outputs of the current sensor 15, voltage sensor 17 and temperature sensor 19 are stored after their analog/digital (hereinafter, A/D) conversion in an interface circuit (hereinafter, I/F) 21; and nonvolatile memories (hereinafter, NVM) 25 and 27 connected to the microcomputer 23.

The microcomputer 23 comprises a CPU 23a, RAM 23b and ROM 23c, wherein the CPU 23a is connected to the I/F 21 and NVM 25 besides the RAM 23b and ROM 23c, also to the starter switch, ignition switch, accessory switches and switches of the electrical equipments (loads) except the motor generator 5.

The RAM 23b has a data area for memorizing various data and a work area for use in various processings. The ROM 23c installs and stores: control programs for making the CPU 23a implement various processings; and revision data for revising the value of the residual voltage drop $e_0$ stored and memorized in the NVM 27 in response to the temperature $h_1$ of or around the battery 13 when the open circuit voltage OCV of the battery 13 is stored and memorized in the NVM25 and the temperature $h_2$ of or around the battery 13 when the estimated voltage Vn, which is estimated by the process as described later on and is the estimated terminal voltage V in the constant load discharge state of the battery 13, is estimated.

Figure 3:
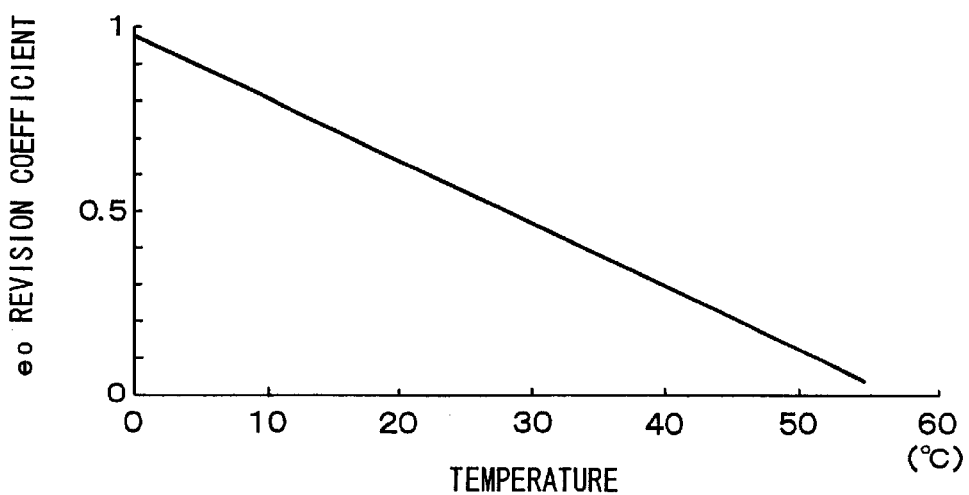
FIG. 3 shows a graph illustrating an example of revision data of the residual voltage drop, which are stored in a ROM of a microcomputer shown in FIG. 2.

In this connection, as shown in FIG. 3, the revision data of the residual voltage drop $e_0$ stored in the ROM 23c is a temperature vs. revision coefficient relationship, in which each revision coefficient at the corresponding temperature between 0° C. to 55° C. is shown assuming that the revision coefficient at 0° C. is set to be "1".

In the NVM (corresponding to the second memory means) 25, the terminal voltage V in an equilibrium state of the battery 13 that changes in response to the change in the charging capacity, that is, the state in which the voltage rise or drop is completely canceled out and does not remain, is stored and memorized as the open circuit voltage OCV of the battery 13, and the temperature in the engine room, which is detected by the temperature sensor 19 upon the memorization, is also stored and memorized.

When the hybrid vehicle is manufactured, the terminal voltage V of the battery 13, which is independently measured upon the mounting, is stored and memorized in the NVM 25 in advance as the open circuit voltage OCV. The temperature $h_1$ of or around the battery 13 upon the storing and memorization of the open circuit voltage OCV is also stored and memorized in the NVM 25 in advance.

In the NVM 27 (corresponding to the first memory means), a value of the residual voltage drop $e_0$ that is a residual voltage drop due to the residual polarization at the end of the discharge of the battery 13 is stored and memorized. Here, the value of the residual voltage drop $e_0$ is obtained by subtracting the estimated voltage Vn from the open circuit voltage OCV of the battery 13 stored and memorized in the NVM 25. The estimated voltage Vn, which is an estimated terminal voltage V in the constant load discharging state of the battery 13, is estimated by the processing as described later on on the basis of a correlation between the terminal voltage V and the discharge current I of the battery 13 when the battery 13 instantaneously implements the constant load discharge in order to start the engine 3 by the motor generator 5 in response to the switching on of the ignition switch.

The outputs of the current sensor 15, voltage sensor 17 and temperature sensor 19 are always stored into the CPU 23a of the microcomputer 23 via the I/F 21.

In the following, the processing that the CPU 23a performs according to the control programs installed in the ROM 23c will be explained with reference to flow charts shown in FIG. 4–7.

Figure 4:
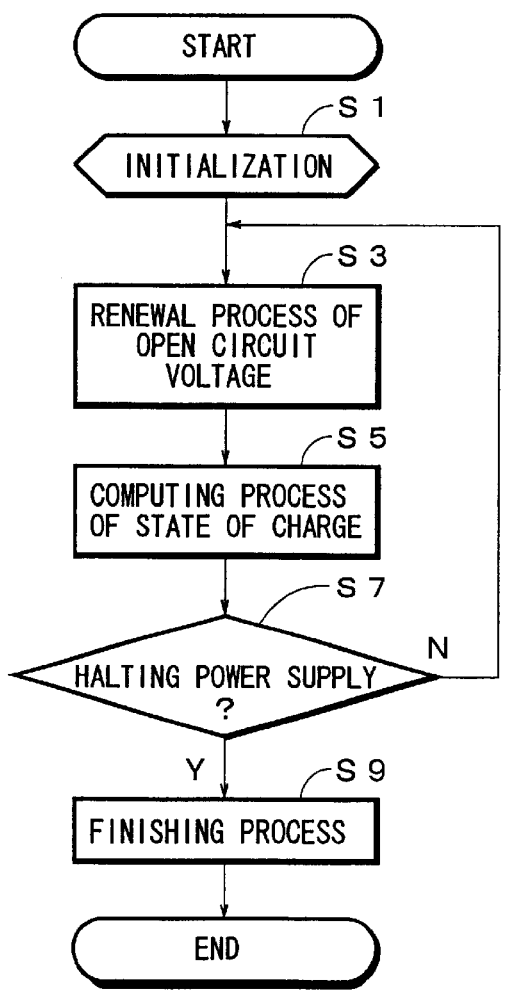
FIG. 4 is a flow chart illustrating a main routine of the processing, which is performed by a CPU according to a controlling program installed in the ROM of the microcomputer shown in FIG. 2.

When the microcomputer 23, which receives the power from the battery 13, is started to start the program, the CPU 23a implements an initialization as shown in a flow chart of a main routine in FIG. 4 (step In the initialization of the step S1, a reset of a flag in a flag area provided in the work area in the RAM 23b, a zero reset of a timer area therein, a start of the time counting and so forth are carried out.

After the initialization in step S1 is finished, a renewing process of the open circuit voltage (step S3) and a calculating process of the state of charge (step S5) are continuously implemented, then whether the power supply from the battery 13 is cut or not is checked (step S7), then if not cut (N at step S7), the system returns back to step S3, on the other hand if cut (Y at step S7), a finishing process is implemented (step S9), and a series of the processes is completed.

Figure 5:
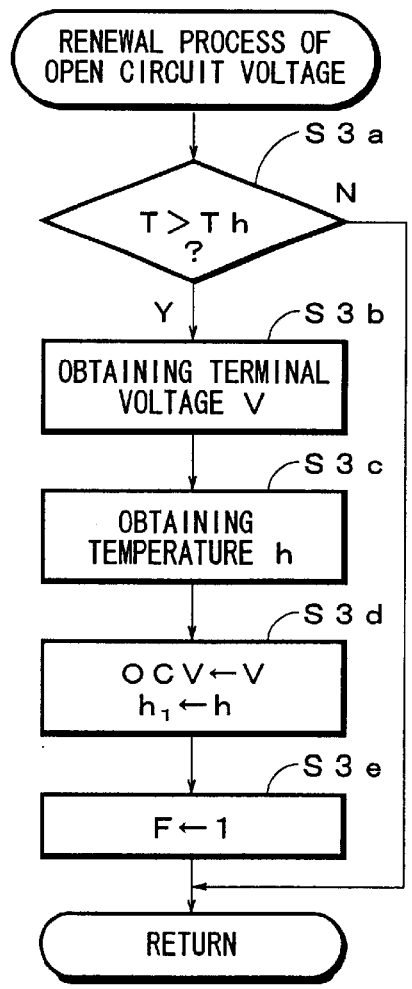
FIG. 5 is a flow chart of a subroutine illustrating the renewing process of the open circuit voltage shown in FIG. 4.

As shown in a flow chart of a subroutine in FIG. 5, in the renewing process of the open circuit voltage at step S3, whether or not a timer value T in the timer area in the RAM 23b exceeds a predetermined period of time Th that is needed to cancel out the polarization from a state of arising the maximum polarization is checked (step S3a), then if not exceed Th (N at step S3a), the renewing process of the open circuit voltage is finished and the system returns back to the main routine in FIG. 4, on the other hand if exceeds Th (Y at step S3a), an A/D converted value of the terminal voltage V of the battery 13, which is detected by the voltage sensor 17, is obtained from the I/F 21 (step S3b) and an A/D converted value of the temperature h in the engine room, which is detected by the temperature sensor 19, is obtained from the I/F 21 (step S3c).

Then, the open circuit voltage OCV of the battery 13 stored and memorized in the NVM 25 and the temperature $h_1$ of or around the battery 13 upon the storing and memorization of the open circuit voltage OCV are replaced by the terminal voltage V of the battery 13 obtained at the steps S3b and S3c and the A/D converted value of the temperature h in the engine room, respectively (step S3d), then after a flag F in the flag area of the equilibrium state in the RAM 23b is set to be "I" (step S3e), the renewing process of the open circuit voltage is finished and the system returns back to the main routine in FIG. 4.

Figure 6:
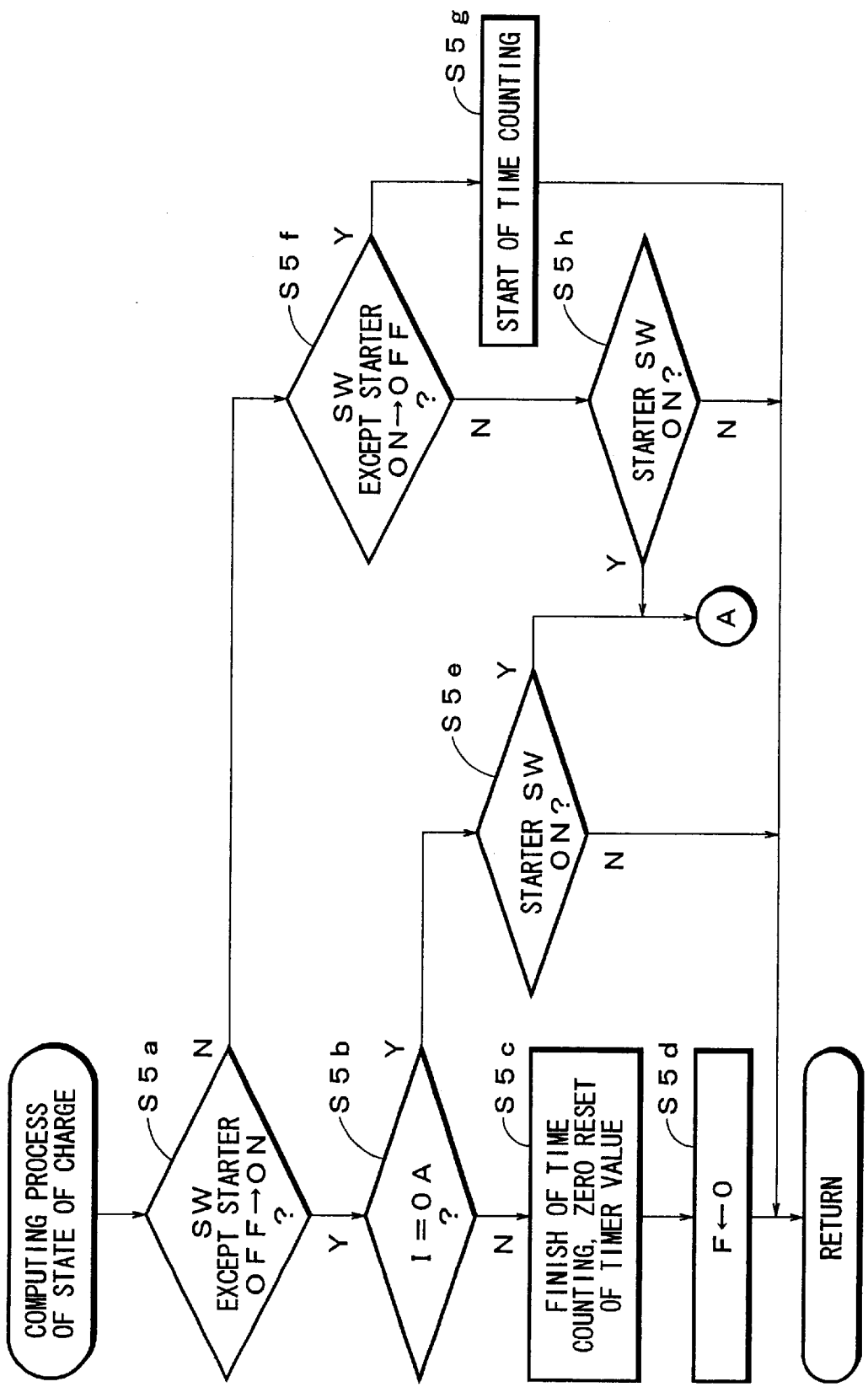
FIG. 6 is a flow chart of a subroutine illustrating the process for computing the state of charge shown in FIG. 4.

As shown in a flow chart of a subroutine in FIG. 6, in the calculating process of the state of charge at step S5, whether or not the switching state of the switches except the starter switch is changed from turning off to switching on is checked (step S5a), then if not changed (N at step S5a), the system advances to a step S5f as described later on, on the other hand if changed (Y at step S5a), whether the discharge current I of the battery 13, which is detected by the current sensor 15 and obtained as an A/D converted value from the I/F 21, is 0 A (ampere) or not is checked (step S5b).

Then if the discharge current I of the battery 13 is not 0 A (N at step S5b), the time counting in the timer area in the RAM 23b is finished and the timer value T is reset to be zero (step S5c), then after the flag F in the flag area of the equilibrium state is set to be "1" (step S5d), the calculating process of the state of charge is finished and the system returns back to the main routine in FIG. 4, on the other hand if the discharge current I of the battery 13 is 0 A (Y at step S5b), whether or not the starter switch is switched on is checked (step S5e).

If the starter switch is not switched on (N at step S5e), the calculating process of the state of charge is finished and the system returns back to the main routine in FIG. 4, on the other hand if switched on (Y at step S5e), the system advances to a step S5j as described later on.

To the contrary, in the step S5f, to which the system advances when the switching state of the switches except the starter switch is not changed from turning off to switching on (N), whether or not the switching state of the switches except the starter switch is changed from switching on to turning off is checked, then if not changed (N at step S5f), the system advances to a step S5h as described later on, on the other hand if changed (Y at step S5f), the time counting in the timer area in the RAM 23b is started (step S5g), then the calculating process of the state of charge is finished and the system returns back to the main routine in FIG. 4.

In the step S5h, to which the system advances when the switching state of the switches except the starter switch is not changed from switching on to turning off in the step S5f, whether or not the starter switch is switched on is checked (step S5h), then if the starter switch is not switched on (N at step S5h), the calculating process of the state of charge is finished and the system returns back to the main routine in FIG. 4, on the other hand if switched on (Y at step S5h), the system advances to a step S5j.

Figure 7:
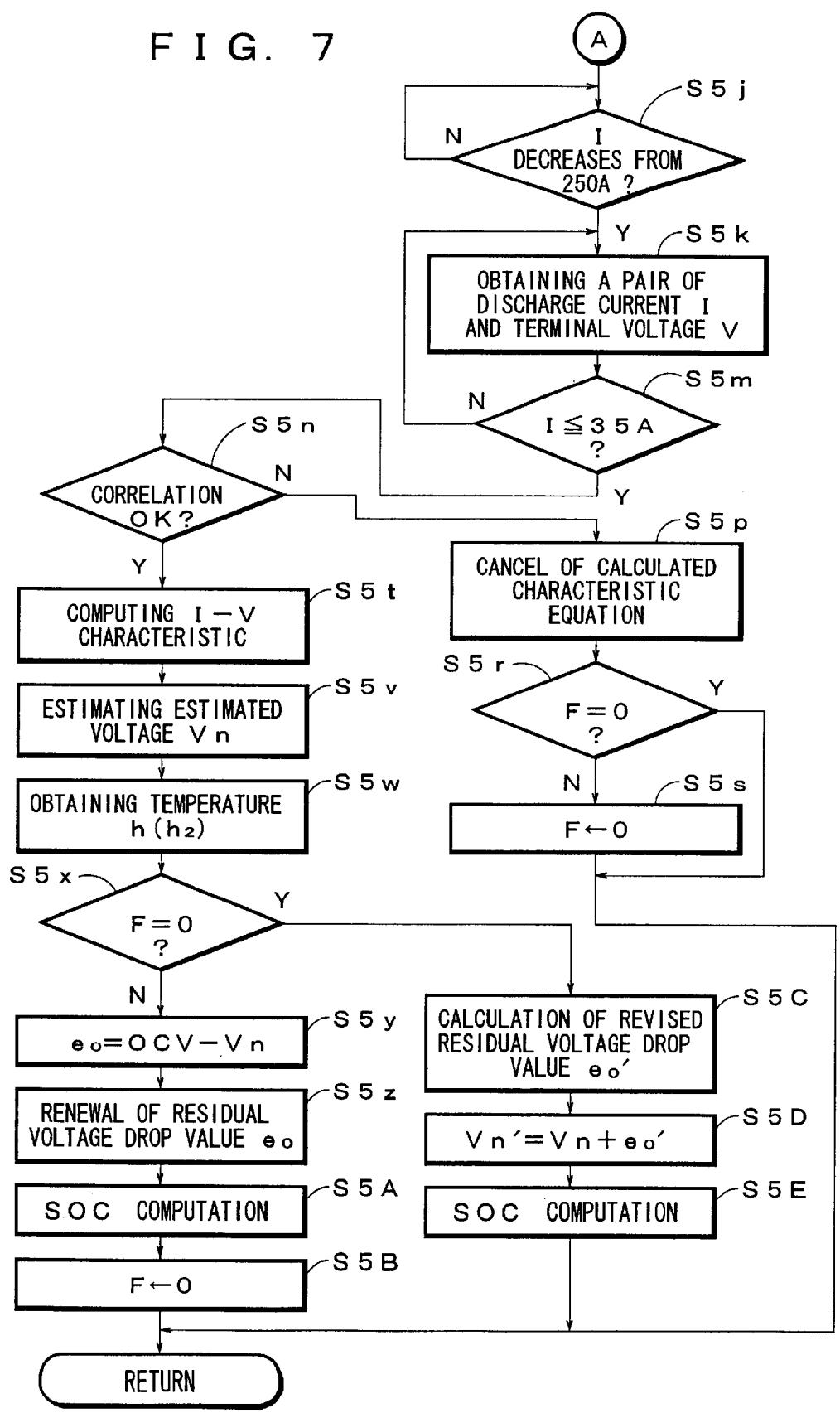
FIG. 7 is a flow chart of a subroutine illustrating the process for computing the state of charge shown in FIG. 4.

In the step S5j, to which the system advances when the starter switch is switched on in the steps S5e and S5h, as shown in a flow chart in FIG. 7, after the discharge current I of the battery 13, which is obtained from the I/F 21 as an A/D converted value and detected by the current sensor 15, reaches 250 A, whether or not the discharge current I starts decreasing is checked.

Then if not start decreasing (N at step S5j), the step S5j is repeated until the discharge current I starts decreasing, and on the other hand if start decreasing (Y at step S5j), an A/D converted value of the discharge current I of the battery 13 detected by the current sensor 15 and an A/D converted value of the terminal voltage V of the battery 13 detected by the voltage sensor 17 are obtained from the I/F 21 as a pair of values (step S5k), then whether or not thus obtained discharge current I of the battery 13 detected by the current sensor 15 decreases to 35 A is checked (step S5m).

If the discharge current I of the battery 13 does not decrease to 35 A (N at step S5m), the system returns back to the step S5k, on the other hand if decreases to 35 A (Y at step S5m), a plurality of pairs of the A/D converted values of the terminal voltage V and the discharge current I of the battery 13, which are obtained in the step S5k until that time, are used to calculate a correlation coefficient r for checking the correlation of the data, then whether or not a value of the correlation coefficient r is within a tolerance range, i.e. −0.9>r>−0.1 or not is checked (step S5n).

If the correlation coefficient r is within the tolerance range, i.e. the correlation is YES (Y at step S5n), the system advances to a step S5t as described later on, on the other hand if the correlation coefficient r is not within the tolerance range, i.e. the correlation is NO (N at step S5n), pairs of the A/D converted values of the discharge current I of the battery 13 detected by the current sensor 15 and the terminal voltage V of the battery 13 detected by the voltage sensor 17, which are obtained in the step S5k, are canceled (step S5p), then whether or not the flag F in the flag area of the equilibrium state is "0" is checked (step S5r).

If the flag F is "1" (Y at step S5r), the calculating process of the state of charge is finished and the system returns back to the main routine in FIG. 4, on the other hand if the flag F is not "0" (N at step S5r), the flag F is set to be "0" (step S5s), then the calculating process of the state of charge is finished and the system returns back to the main routine in FIG. 4.

In the step S5t, to which the system advances, if the correlation coefficient r is within the tolerance range, i.e. the correlation is YES, the method of least squares is applied to the pairs of the A/D converted values of the discharge current I of the battery 13 detected by the current sensor 15 and the terminal voltage V of the battery 13 detected by the voltage sensor 17, which are obtained in the step S5k, so as to calculate a linear voltage-current characteristic equation V=aI+b, then an imaginary current value Is=−10 A, by which the estimated voltage Vn in the constant current discharge shows a linear characteristic with respect to the capacity of the battery 13, is substituted into the voltage-current characteristic equation V=aI+b, which is calculated in the step S5t, so as to estimate the estimated voltage Vn (step S5v).

The A/D converted value of the temperature h in the engine room detected by the temperature sensor 19 is obtained from the I/F 21 as the temperature $h_2$ of or around the battery 13 upon the estimation of the estimated voltage Vn (step S5w), then whether or not the flag F in the flag area of the equilibrium state is "0" is checked (step S5x).

If the flag F is "0" (Y at step S5x), the system advances to a step S5C described later on, on the other hand if the flag is not "0" (N at step S5x), a value of the residual voltage drop $e_0$ is calculated by subtracting the estimated voltage Vn, which is estimated in the step S5v, from the open circuit voltage OCV stored and memorized in the NVM 25 (step S5y), then the value of the residual voltage drop $e_0$ stored and memorized in the NVM 27 is replaced by the value of the residual voltage drop $e_0$ calculated in the step S5y (step S5z).

Then, the estimated voltage Vn estimated in the step S5v is substituted into either the equation:

$$SOC = \{(Vn - Ve)/(Vs - Ve)\} \times 100\ (\%); \text{ or}$$

$$SOC = \{[(Vn + Ve)/2] \times [(Vn - Ve)/(Vs - Ve)] \times Ah\}/$$
$$\{[(Vs + Ve)/2] \times Ah\} \times 100\ (\%)$$
$$= \{(Vn^2 - Ve^2)/(Vs^2 - Ve^2)\} \times 100\ (\%),$$

wherein Vs is the open circuit voltage upon the fully charged state and Ve is the open circuit voltage at the end of the discharge, so as to calculate the state of charge SOC of the battery 13 (step S5A), then after the flag F in the flag area of the equilibrium state is set to be "0" (step S5B), the calculating process of the state of charge is finished and the system returns back to the main routine in FIG. 4.

In the step S5C, to which the system advances if the flag F in the flag area of the equilibrium state is "0", on the basis of the temperature $h_2$ of or around the battery 13 upon the estimation of the estimated voltage Vn obtained in the step S5v and the temperature $h_1$ of or around the battery 13 when the open circuit voltage OCV of the battery 13 stored and memorized in the NVM 25 is stored and memorized in the NVM 25, the coefficient of the revision data stored in the ROM 23c revises the value of the residual voltage drop $e_0$ stored and memorized in the NVM 27 so as to calculate a revised value of the residual voltage drop $e_0'$, which is then added to the estimated voltage Vn obtained in the step S5v, thereby a revised estimated voltage Vn' is calculated (step S5D).

Then, the revised estimated voltage Vn' calculated in the step S5D is substituted into either the equation for calculating by using a voltage ratio:

$$SOC=\{(Vn'-Ve)/(Vs-Ve)\}\times 100(\%),$$

or the equation for calculating by using an electric power ratio:

$$SOC = \{[(Vn' + Ve)/2] \times [(Vn' - Ve)/(Vs - Ve)] \times Ah\}/$$
$$\{[(Vs + Ve)/2] \times Ah\} \times 100\ (\%)$$
$$= \{[Vn^{2'} - Ve^2)/Vs^2 - Ve^2)\} \times 100\ (\%),$$

wherein Vs is the open circuit voltage upon the fully charged state and Ve is the open circuit voltage at the end of the discharge, so as to calculate the state of charge SOC of the battery 13 (step S5E), then the calculating process of the state of charge is finished and the system returns back to the main routine in FIG. 4.

As apparent from the explanation described above, in the apparatus 1 for computing a battery capacity according to this preferred embodiment, the step S5t in the flow chart shown in FIG. 7 is the process corresponding to the first calculating means 23A described in the claims, the step S5$v$ in FIG. 7 is the process corresponding to the estimating means 23B described in the claims, and the step S5$j$ in FIG. 7 is the process corresponding to the second calculating means 23D described in the claims.

In the apparatus 1 for computing a battery capacity according to this preferred embodiment, the step S3$a$ in the flow chart shown in FIG. 5 is the process corresponding to the judging means 23C described in the claims, the step S3$d$ in FIG. 5 is the process corresponding to the replacing means 23E described in the claims, and the step S5C in FIG. 7 is the process corresponding to the revising means 23F described in the claims.

In the apparatus 1 for computing a battery capacity according to this preferred embodiment, the current sensor 15 and the step S5$j$ in FIG. 7 constitute the first detecting means A described in the claims, the current sensor 15 and the step S5$m$ in FIG. 7 constitute the third detecting means C described in the claims, and the voltage sensor 17 and the step S3$b$ in FIG. 5 constitute the measuring means B described in the claims.

In the apparatus 1 for computing a battery capacity according to this preferred embodiment, as to the discharge current I of the battery 13, 250 A corresponds to the predetermined large current value described in the claims while 35 A corresponds to the target current value described in the claims.

In the following, an operation of the apparatus for computing a battery capacity according to this preferred embodiment constructed as described above will be explained.

In the state that the electrical equipments (loads) in the hybrid vehicle except the motor generator 5 are in operation or the motor generator 5 functioning as a motor is in operation so that the battery 13 is in the discharge process, or in the state that the motor generator 5 functioning as a generator is in operation so that the battery 13 is in the charge process, the renewal of the open circuit voltage OCV stored and memorized in the NVM 25, the renewal of the temperature $h_1$ of or around the battery 13 upon the storing and memorization of the open circuit voltage OCV into the NVM 25, and the renewal of the value of the residual voltage drop $e_0$ stored and memorized in the NVM 27 are not carried out. Neither the estimation of the estimated voltage Vn nor the calculation and renewal of the state of charge SOC by using the estimated voltage Vn is carried out.

Then, with the switching on of the starter switch, the motor generator 5 in the hybrid vehicle starts operating functioning as a starter motor, then when the battery 13 is subjected to the constant load discharge with the predetermined large current value exceeding 250 A, pairs of the discharge current I and the terminal voltage V of the battery 13, which are detected by the current sensor 15 and the voltage sensor 17, respectively, are periodically collected until the discharge current I of the battery 13 decreases to the target current value of 35 A. If the pair of the discharge current I and the terminal voltage V meets the predetermined correlation, the linear voltage-current characteristic equation V=aI+b of the battery is calculated by using the method of least squares, then the imaginary current value Is=−10 A, by which the estimated voltage Vn in the constant current discharge shows a linear characteristic with respect to the capacity of the battery 13, is substituted into the voltage-current characteristic equation V=aI+b, thereby the estimated voltage Vn is estimated.

On the basis of the temperature $h_2$ of or around the battery 13 upon the estimation of the estimated voltage Vn and the temperature $h_1$ of or around the battery 13 when the open circuit voltage OCV of the battery 13 stored and memorized in the NVM 25 is stored and memorized in the NVM 25, the value of the residual voltage drop $e_0$ stored and memorized in the NVM 27 is revised for the temperature compensation, then thus revised value of the residual voltage drop $e_0'$ is added to the estimated voltage Vn, thereby the revised estimated voltage Vn' is calculated. Then, the revised estimated voltage Vn' is substituted into either the equation for the calculation using a voltage ratio or the equation for the calculation using an electric power ratio so as to calculate the state of charge SOC of the battery 13 and thus calculated results are provided as data for displaying and capacity controlling.

The discharge current I and the terminal voltage V, a pair of which is periodically collected in order to calculate the voltage-current characteristic equation V=aI+b of the battery 13 for use in the estimation of the estimated voltage V, is collected during the discharge to the motor generator 5, which functions as a starter motor that is the maximum load in the hybrid vehicle, and is collected also in the state that the discharge current I exceeding 35 A flows. The current of 35 A is never reached even when the electric power of the battery 13 is simultaneously applied to a plurality of the other loads except the motor generator 5.

Therefore, even if the electric power of the battery 13 is simultaneously applied to the other loads except the motor generator 5 and the voltage drop due to the resultant polarization at the discharging side arises, the value of the residual voltage drop $e_0$, which is calculated as a value of the residual voltage drop due to the residual polarization at the end of the discharge to the motor generator, is added to the estimated voltage Vn, thereby the actual state of charge SOC of the battery 13 can be accurately computed.

In the apparatus 1 for computing a battery capacity according to this preferred embodiment, with the switching on of the starter switch, when the battery 13 is subjected to the constant load discharge with exceeding 250 A, if the battery 13 has not been subjected to the charge and discharge for a period of time exceeding a predetermined period of time T, which is required for the cancellation of the polarization from the state of arising the maximum polarization, before the discharge starts, the battery 13 is considered to be in an equilibrium, in which the voltage change (voltage rise or voltage drop) due to the polarization arisen when the battery 13 is subjected to the former charge or discharge is completely canceled out, then the open circuit voltage OCV of the battery 13 stored and memorized in the NVM 25 is replaced by the terminal voltage V of the battery 13, which is detected at this time.

Therefore, even if the open circuit voltage OCV changes due to the change in the capacity of the battery 13, each time the battery 13 reaches an equilibrium state, the open circuit voltage OCV of the battery 13 stored and memorized in the NVM 25 is replaced by the newest value, thereby the computation accuracy of the state of charge of the battery 13 can be maintained high.

Similarly, in the apparatus 1 for computing a battery capacity according to this preferred embodiment, when the discharge of the battery 13 to the motor generator 5 functioning as a starter motor is carried out starting from an equilibrium state of the battery 13, the value of the residual voltage drop $e_0$ of the battery 13 stored and memorized in the NVM 27 is replaced by the newest value of the residual voltage drop $e_0$, which is obtained by subtracting the estimated voltage Vn estimated after the discharge from the open circuit voltage OCV in the NVM 25, which is renewed before the discharge starts.

Therefore, even if the value of the residual voltage drop $e_0$ changes due to the change in the state of the battery 13, each time the battery 13 reaches an equilibrium state, the value of the residual voltage drop $e_0$ stored and memorized in the NVM 27 is replaced by the newest value, thereby the computation accuracy of the state of charge of the battery 13 can be maintained high.

Further, in the apparatus 1 for computing a battery capacity according to this preferred embodiment, if the temperature $h_1$ of or around the battery 13 when the open circuit voltage OCV is stored and memorized in the NVM 25 is different from the temperature $h_2$ of or around the battery 13 upon the estimation of the estimated voltage Vn, the value of the residual voltage drop $e_0$ is subjected to the revision for the temperature compensation in accordance with the difference so that the revised value of the residual voltage drop $e_0'$ is used for computing the state of charge SOC of the battery 13 with adding to the estimated voltage Vn. Therefore, even if the temperature h of or around the battery 13, which affects the value of the open circuit voltage OCV, is changed between at a time when the value of the residual voltage drop $e_0$ is calculated and a time when the value of the residual voltage drop $e_0$ is added to the estimated voltage Vn so as to compute the state of charge SOC of the battery 13, the state of charge SOC of the battery 13 can be computed with high accuracy taking the change described above into consideration.

A part or all of the construction for the temperature compensation with respect to the value of the residual voltage drop $e_0$ or the construction for renewing the open circuit voltage OCV and/or the value of the residual voltage drop $e_0$, which is employed in this preferred embodiment, may be omitted if these construction is not necessary in order to attain the required accuracy of computation.

A period of time while pairs of the discharge current I and the terminal voltage V of the battery 13 are periodically collected in order to calculate the voltage-current characteristic equation V=aI+b of the battery 13 for use in estimating the estimated voltage Vn may not be limited to the period of time while the discharge current I decreases from 250 A to 35 A when the battery 13 is subjected to the constant load discharge with the current exceeding 250 A, like the apparatus 1 for computing a battery capacity according to this preferred embodiment.

Figure 8:
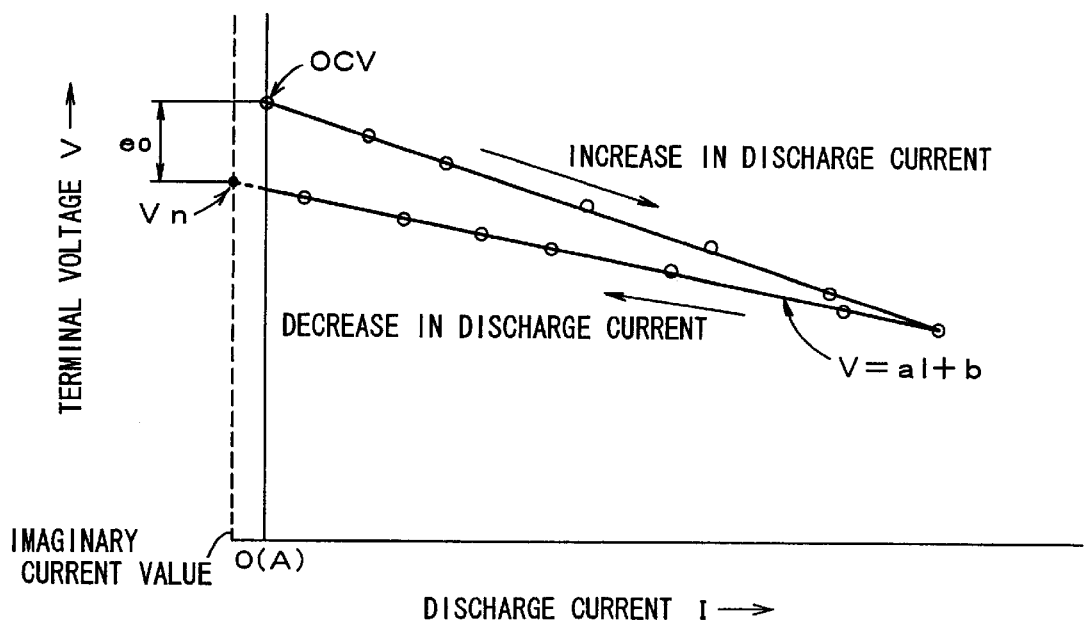
FIG. 8 shows graphs illustrating a difference in general voltage-current characteristics between the periods of increase and decrease in discharge current in the constant load discharging process of the battery that is in an equilibrium state.
Figure 9:
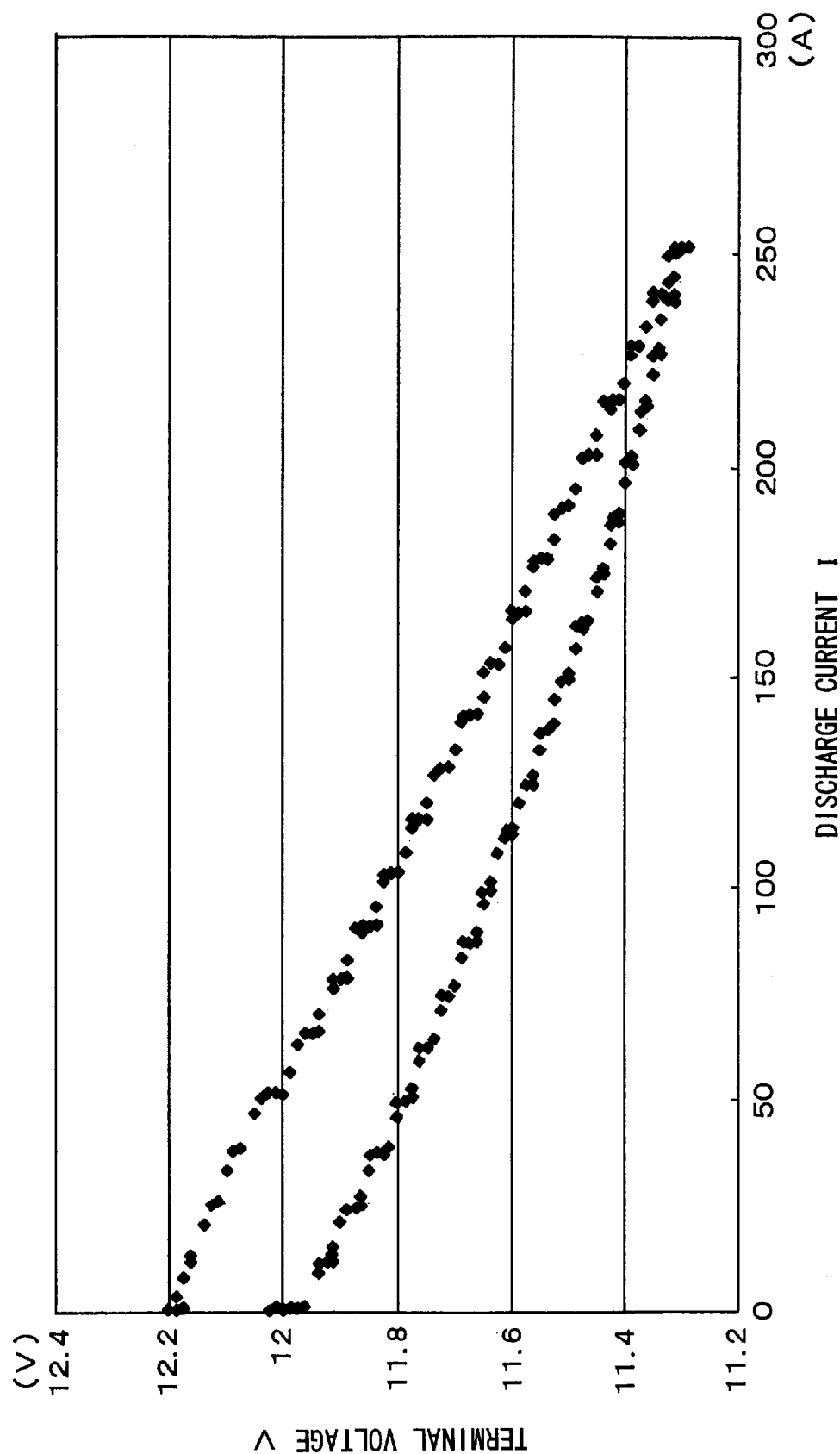
FIG. 9 shows graphs illustrating a difference in voltage-current characteristics between the periods of increase and decrease in discharge current in the 250 A constant load discharging process of the battery of FIG. 2 starting from an equilibrium state.
Figure 11:
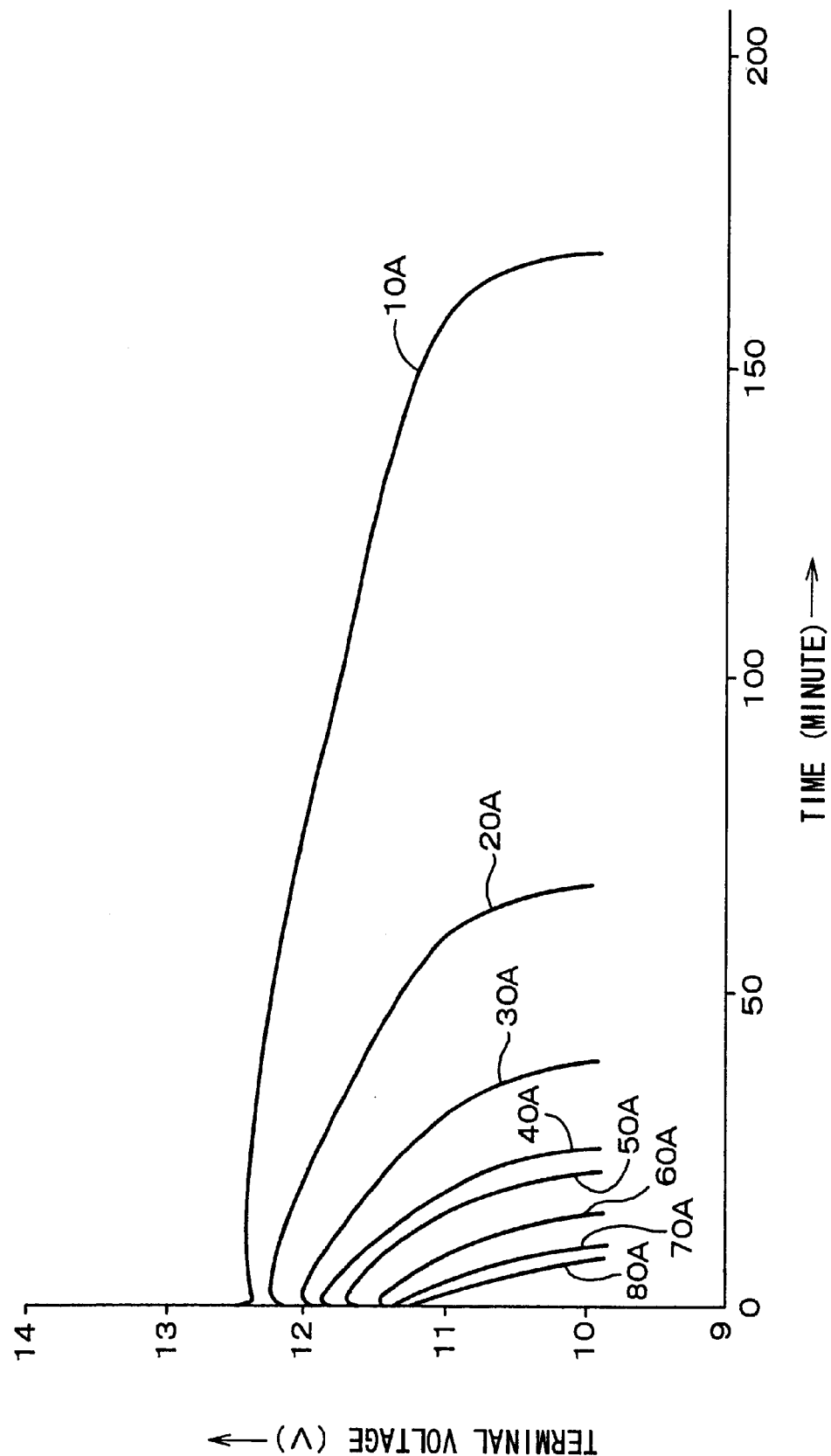
FIG. 11 shows graphs illustrating a correlation between the terminal voltage and the discharge time in a process of the constant current discharge of the battery.
Figure 12:
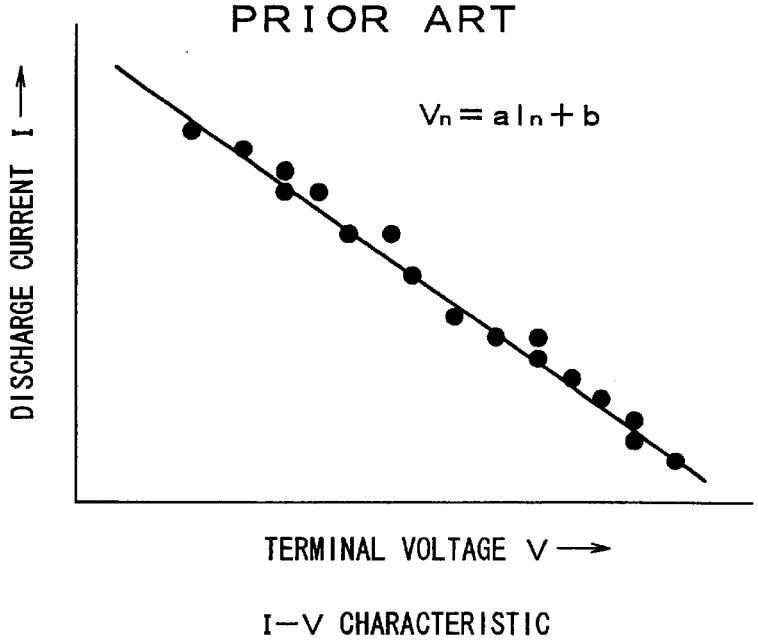
FIG. 12 shows a graph schematically illustrating a relation between the sampled sets of the terminal voltage and the discharge current, which are sampled in a process of the constant current discharge of the battery, and the linear voltage-current characteristic equation, which is obtained from the sets by using the method of least squares.
Figure 13:
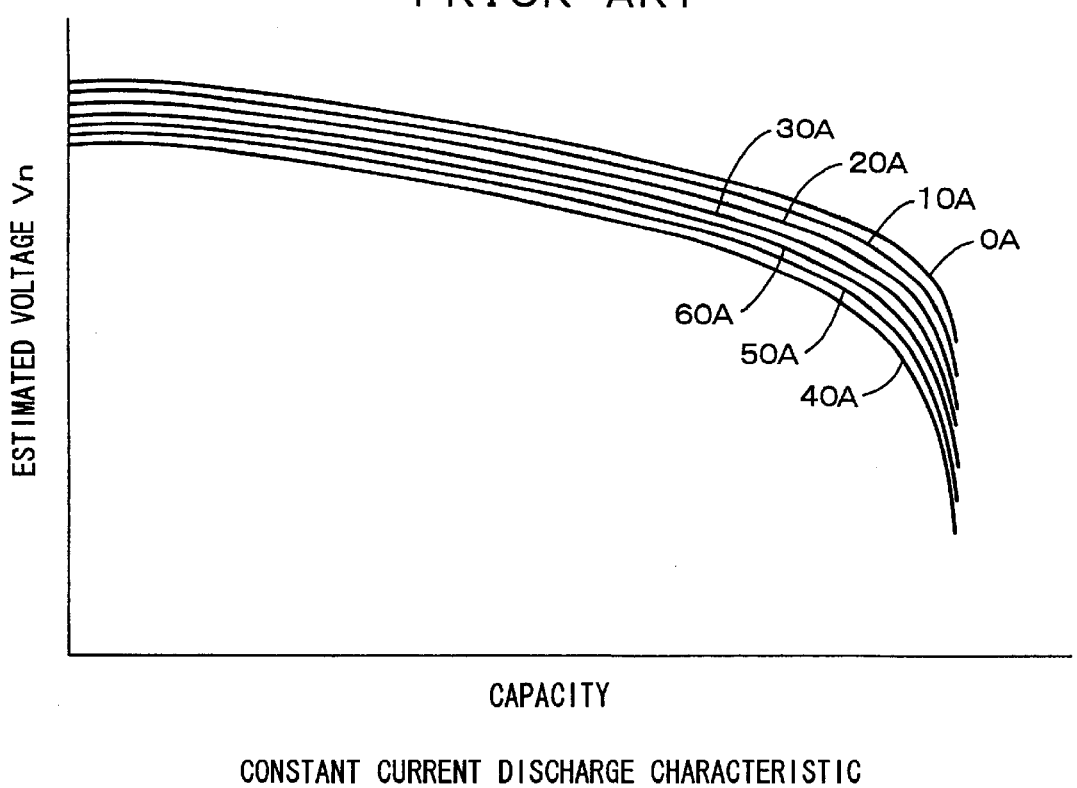
FIG. 13 shows graphs illustrating a plurality of constant current discharge characteristics obtained from the estimated voltage, which is estimated from the voltage-current characteristic shown in FIG. 12.
Figure 14:
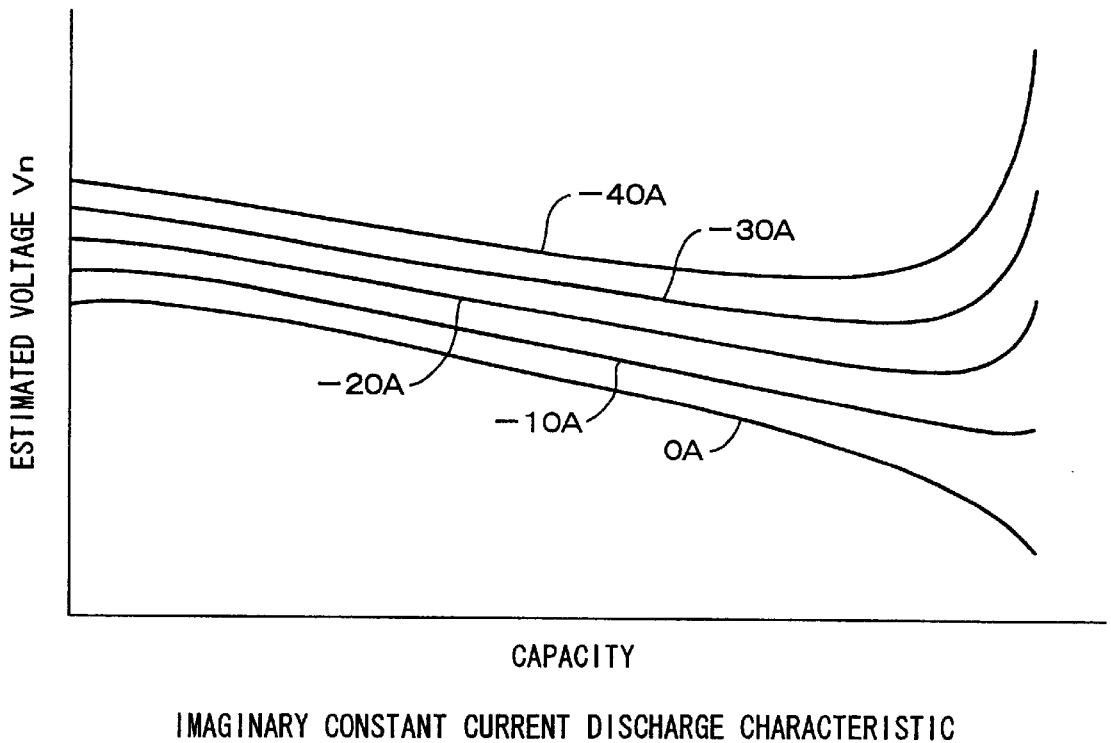
FIG. 14 shows graphs illustrating a plurality of imaginary constant current discharge characteristics obtained from the estimated voltage, which is estimated from the voltage-current characteristic shown in FIG. 12.
Figure 16:
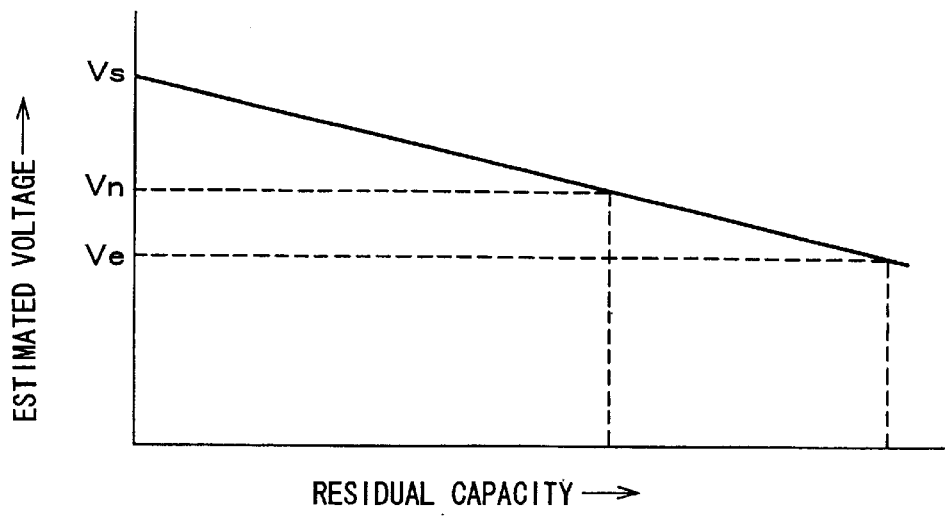
FIG. 16 shows a graph illustrating a relationship between the battery capacity at the imaginary discharge current value that shows a linear characteristic in the graph shown in FIG. 14 and the estimated voltage estimated from the voltage-current characteristic shown in FIG. 12.
Figure 17:
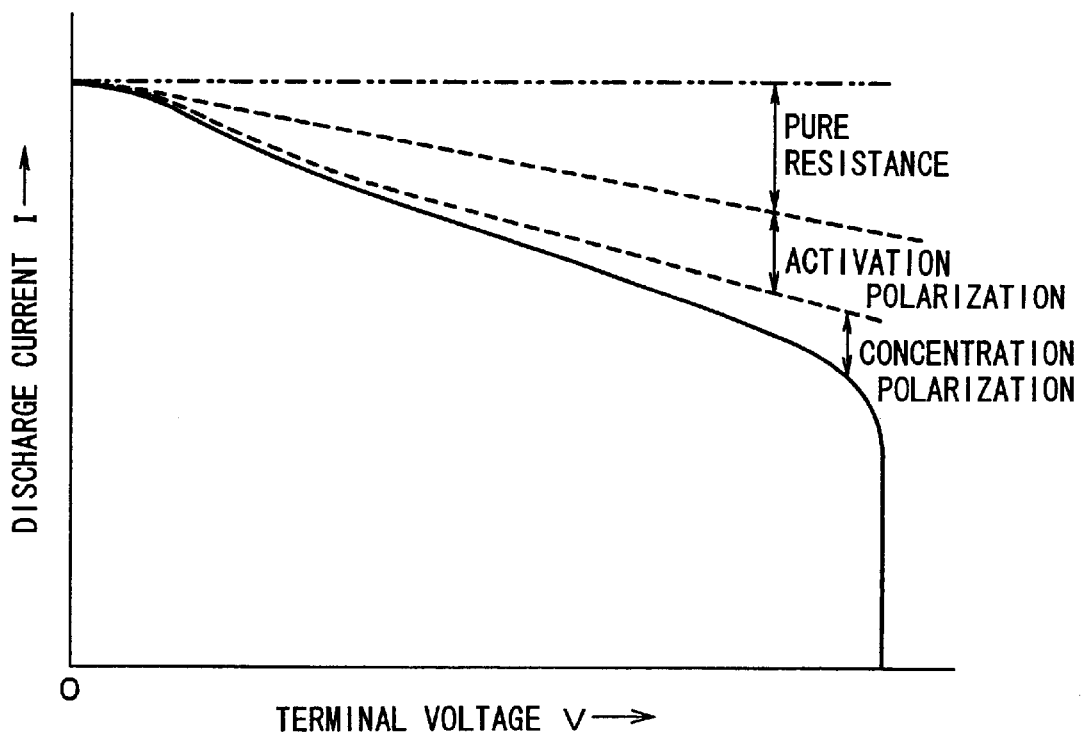
FIG. 17 shows a graph illustrating the voltage drop occurring during the discharge process of the battery.

However generally, as shown in FIG. 8, the voltage-current characteristic during the discharge of the battery 13 is different between a time of increase in the discharge current I and a time of decrease in the discharge current I. When the discharge current I and the terminal voltage V are actually measured while the battery 13 is subjected to the constant load discharge with the current exceeding 250 A, as showm in FIG. 9, since a pace that the voltage drop due to the polarization arisen in the battery 13 caused by the discharge is canceled out in response to the decrease in the discharge current I delays behind a pace that the voltage drop due to the polarization in the battery 13 caused by the discharge arises in response to the increase in the discharge current I, the terminal voltage V during the decrease of the discharge current I becomes lower than that during the increase of the discharge current I.

Figure 10:
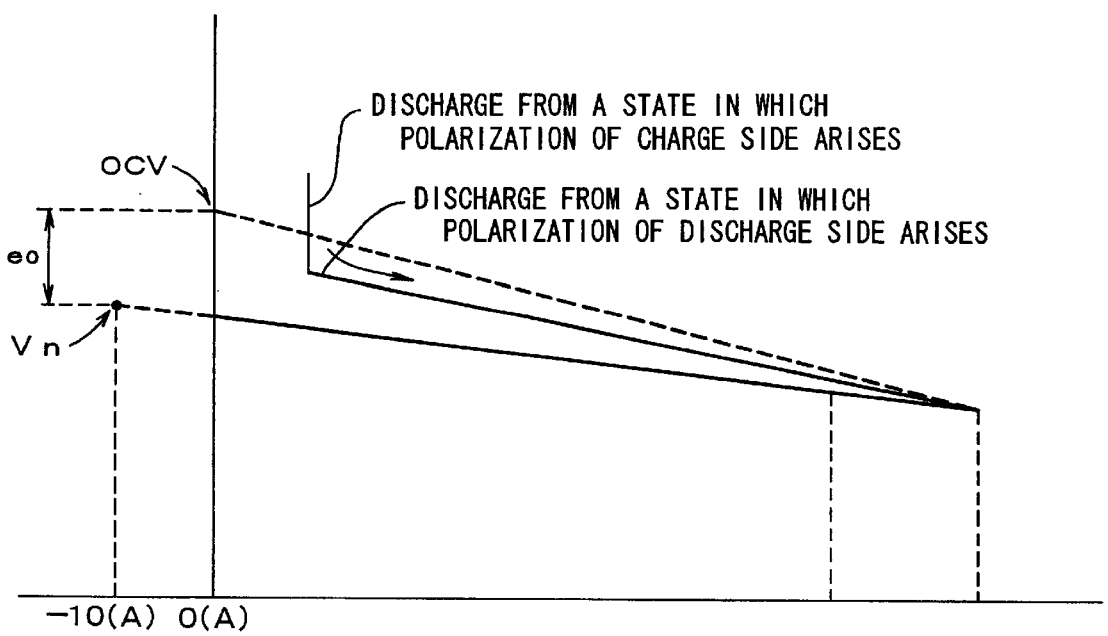
FIG. 10 shows graphs illustrating a difference in general voltage-current characteristics between the periods of increase and decrease in discharge current in the constant load discharging process of the battery that is not in an equilibrium state.

Furthermore, when the discharge of the battery 13 is started on the condition that the voltage rise or the voltage drop due to the former charge or discharge remains, as shown in FIG. 10, the voltage-current characteristic during increase in the discharge current I differs from that when the discharge is started from an equilibrium state, which is explained with reference to FIG. 8.

That is, the voltage-current characteristic of the battery 13 is different between a time of increase in the discharge current I and a time of decrease in the discharge current I and in addition, the voltage-current characteristic during the increase of the discharge current I is also different depending upon whether the battery 13 before the start of the discharge was in an equilibrium state or not. Therefore, as long as the difference in the characteristic is not confirmed such that the difference causes just an acceptable error, the voltage-current characteristic equation V=aI+b may be well calculated by using only the data of the discharge current I and the terminal voltage V of the battery 13, which are periodically collected only while the discharge current I is decreasing, like the apparatus 1 for computing a battery capacity according to this preferred embodiment.

In the apparatus 1 for computing a battery capacity according to this preferred embodiment, the open circuit voltage OCV of the battery 13 stored and memorized in the NVM 25 indicates a point at the discharge current I=0 A on the line of the voltage-current characteristic during the increase in the discharge current I in FIG. 8. On the other hand, the estimated voltage Vn estimated from the voltage-current characteristic of the battery 13, which is calculated by using only the data of the discharge current I and the terminal voltage V of the battery 13 periodically collected only while the discharge current I decreases from 250 A to 35 A, indicates a point at the imaginary discharge current value Is=−10 A on the line of the voltage-current characteristic during the decrease in the discharge current I in FIG. 8.

A period of time while pairs of the discharge current I and the terminal voltage V of the battery 13 are periodically collected in order to calculate the voltage-current characteristic equation V=aI+b of the battery 13 is limited to the period of time while the discharge current I decreases from 250 A, but may not be limited to the period of time while the discharge current I decreases to 35 A.

However, like the apparatus 1 for computing a battery capacity according to this preferred embodiment, since pairs of the discharge current I and the terminal voltage V of the battery 13 are periodically collected only while the discharge current I decreases from 250 A to 35 A, even when the electric power from the battery 13 is simultaneously applied to the other loads except the motor generator 5 functioning as a starter motor, a polarization of the discharge side exceeding the polarization of the discharge side due to the discharge of the battery 13, which arises so as to supply the electric power to the other loads, arises due to the discharge of the battery 13 with the discharge current I of 35 A.

Therefore, the polarization of the discharge side arisen by the discharge for supplying the electric power to the other loads except the motor generator 5 is prevented from affecting the discharge current I or the voltage-current characteristic of the battery 13 calculated from the discharge current I. That is, the residual component, which is free from the component that is canceled out due to the decrease in discharge current I to 35 A, of the voltage drop due to the polarization of the discharge side arisen by the discharge with the discharge current of 250 A, which is carried out in order to operate the motor generator 5, can purely influence the discharge current I or the voltage-current characteristic of the battery 13 calculated from the discharge current I. Consequently, the state of charge SOC of the battery 13 can be accurately computed even if the electric power is supplied to the other loads except the motor generator 5.

INDUSTRIAL APPLICABILITY

As explained in the aforementioned preferred embodiments, according to the method for computing a battery capacity of the present invention, the terminal voltage of the battery, which is periodically measured together with the discharge current during the constant load discharge, includes the voltage drop due to the discharge, then even if the voltage-current characteristic caluculated from the terminal voltage and the present estimated voltage of the battery estimated from the voltage-current characteristic are influenced by the voltage drop dur to the discharge, the residual voltage drop value due to the residual polarization at the end of the constant load discharge, which is implemented by the battery with the predetermined large current value corresponding to the maximum supplying power value to the loads of the vehicle and is identical with the component of the voltage drop influenced on the estimated voltage, is added to the present estimated voltage of the battery so that the component of the voltage drop influenced on the estimated voltage is canceled out by the residual voltage drop value, thereby the state of charge of the battery can be accurately computed.

According to the method for computing a battery capacity of the present invention, when the battery in an equilibrium state implements the constant load discharge with the predetermined large current value, the open circuit voltage value is obtained and set up, and the estimated voltage estimated later is subtracted from the obtained open circuit voltage so as to obtain the residual voltage drop value, thereby it is not needed that the open circuit voltage and the residual voltage drop value are in advance recognized and set up.

According to the method for computing a battery capacity of the present invention, each time the battery is in an equilibrium state, the open circuit voltage value is replaced by the newest value, and further, each time the open circuit voltage value is replaced by the newest value, the newest residual voltage drop value can be calculated in advance, thereby the state of charge of the battery, which is computed by adding the residual voltage drop value to the present estimated voltage of the battery, can be always accurately computed in response to the change in the open circuit voltage due to the change in the state of charge of the battery and so forth.

According to the method for computing a battery capacity of the present invention, even if the battery implements the constant load discharge with the predetermined large current value on a condition that the voltage-current characteristic is different between at a time during the increase of the discharge current and that during the decrease thereof because the increase or decrease in the voltage drop due to the polarization of the discharge side arises later than the increase or decrease in the discharge current during the constant load discharge and also on a condition that the voltage rise or drop in the terminal voltage of the battery due to the polarization arisen during the former charge and discharge remains, the component of the voltage-current characteristic that always appears as the same characteristic without being influenced by the phenomena described above are employed so that the present estimated voltage of the battery is estimated, thereby the state of charge of the battery can be accurately computed without being influenced by the voltage change due to the polarization arisen during the former charge and discharge.

According to the method for computing a battery capacity of the present invention, the voltage-current characteristic and the estimated voltage, in which the influence of the power supply to the loads of the vehicle except the starter motor is removed, are obtained from the discharge current and the terminal voltage of the battery, which purely reflects the residual component excluding the component that is canceled out due to the decrease of the discharge current to the target current value, of the voltage drop due to the polarization of the discharge side arisen due to the discharge with the predetermined large current value, even if the loads of the vehicle except the starter motor are still driven, thereby the state of charge of the battery can be accurately computed.

According to the method for computing a battery capacity of the present invention, even if the temperature around the battery changes to change the battery capacity and then in response to the capacity the open circuit voltage of the battery is changed against the open circuit voltage used when the residual voltage drop value is calculated in advance, the residual voltage drop value is revised so as to carry out the temperature compensation, thereby the present state of charge of the battery can be accurately computed in response to the present temperature around the battery.

According to the method for computing a battery capacity of the present invention, even if the battery implements the constant load discharge with the predetermined large current value on a condition that the voltage-current characteristic is different between at a time during the increase of the discharge current and that during the decrease thereof because the increase or decrease in the voltage drop due to the polarization of the discharge side arises later than the increase or decrease in the discharge current during the constant load discharge and also on a condition that the voltage rise or drop in the terminal voltage of the battery due to the polarization arisen during the former charge and discharge remains, the component of the voltage-current characteristic that always appears as the same characteristic without being influenced by the phenomena described above is employed so that the present estimated voltage of the battery is estimated, thereby the state of charge of the battery can be accurately computed without being influenced by the voltage change due to the polarization arisen during the former charge and discharge.

According to the method for computing a battery capacity of the present invention, even if the voltage drop due to the polarization of the discharge side arisen during the former discharge remains, the battery is set in the state that a voltage drop exceeding the voltage drop due to the polarization arises in the terminal voltage of the battery, thereby the state of charge of the battery can be accurately computed without being influenced by the polarization of the discharge side arisen in the former discharge.

According to the method for computing a battery capacity of the present invention, the voltage-current characteristic and the estimated voltage, in which the influence of the power supply to the loads of the vehicle except the starter motor is removed, are obtained from the discharge current and the terminal voltage of the battery, which purely reflects the residual component excluding the component that is canceled out due to the decrease of the discharge current to the target current value, of the voltage drop due to the polarization of the discharge side arisen due to the discharge with the predetermined large current value, even if the loads of the vehicle except the starter motor are still driven, thereby the state of charge of the battery can be accurately computed.

According to the apparatus for computing a battery capacity of the present invention, the terminal voltage of the battery, which is periodically measured together with the discharge current during the constant load discharge, includes the voltage drop due to the discharge, then even if the voltage-current characteristic caluculated from the terminal voltage and the present estimated voltage of the battery estimated from the voltage-current characteristic are influenced by the voltage drop dur to the discharge, the residual voltage drop value memorized by the first memory means due to the residual polarization at the end of the constant load discharge, which is implemented by the battery with the predetermined large current value corresponding to the maximum supplying power value to the loads of the vehicle and is identical with the component of the voltage drop influenced on the estimated voltage, is added to the present estimated voltage of the battery so that the component of the voltage drop influenced on the estimated voltage is canceled out by the residual voltage drop value, thereby the state of charge of the battery can be accurately computed.

According to the apparatus for computing a battery capacity of the present invention, even if the battery implements the constant load discharge with the predetermined large current value on a condition that the voltage-current characteristic is different between at a time during the increase of the discharge current and that during the decrease thereof because the increase or decrease in the voltage drop due to the polarization of the discharge side arises later than the increase or decrease in the discharge current during the constant load discharge and also on a condition that the voltage rise or drop in the terminal voltage of the battery due to the polarization arisen during the former charge and discharge remains, the voltage-current characteristic that always appears as the same characteristic without being influenced by the phenomena described above is calculated by the first calculating means, then the present estimated voltage of the battery is estimated by the estimating means on the basis of thus calculated voltage-current characteristic, thereby the state of charge of the battery can be accurately computed without being influenced by the voltage change due to the polarization arisen during the former charge and discharge.

According to the apparatus for computing a battery capacity of the present invention, when the battery, which is judged to be in an equilibrium state by the judging means, implements the constant load discharge with the predetermined large current value, the residual voltage drop value memorized by the first memory means is calculated by the second calculating means by using the estimated voltage value estimated by the estimating means, thereby it is not needed that the residual voltage drop value are in advance recognized and set up.

According to the apparatus for computing a battery capacity of the present invention, each time the judging means judges that the battery is in an equilibrium state, the replacing means replaces the open circuit voltage value memorized by the second memory means with the terminal voltage of the battery measured by the measuring means so that the open circuit voltage value memorized by the second memory means is always replaced by the newest value, thereby the state of charge of the battery computed by adding the residual voltage drop value to the present estimated voltage of the battery can be always accurately computed in response to the change in the open circuit voltage due to the change in the state of charge of the battery and so forth.

According to the apparatus for computing a battery capacity of the present invention, even if the temperature around the battery detected by the second detecting means changes to change the battery capacity and then in response to the capacity the open circuit voltage of the battery is changed against the open circuit voltage memorized by the second memory means used when the residual voltage drop value is calculated by the second calculating means, the residual voltage drop value is revised by the revising means so as to carry out the temperature compensation, thereby the present state of charge of the battery can be accurately computed in response to the present temperature around the battery.

According to the apparatus for computing a battery capacity of the present invention, the voltage-current characteristic and the estimated voltage, in which the influence of the power supply to the loads of the vehicle except the starter motor is removed, are calculated by the first calculating means and the estimating means, respectively, from the discharge current and the terminal voltage of the battery, which purely reflects the residual component excluding the component that is canceled out due to the decrease of the discharge current and is measured for a period of time from a time when the first detecting means detects that the discharge current of the battery starts decreasing from the predetermined large current value to a time when the third detecting means detects that the discharge current decreases to the target current value, of the voltage drop due to the polarization of the discharge side arisen due to the discharge with the predetermined large current value, even if the loads of the vehicle except the starter motor are still driven, thereby the state of charge of the battery can be accurately computed.

According to the apparatus for computing a battery capacity of the present invention, the terminal voltage of the battery, which is periodically measured together with the discharge current during the constant load discharge, includes the voltage drop due to the discharge, then even if the voltage-current characteristic caluculated from the terminal voltage and the present estimated voltage of the battery estimated from the voltage-current characteristic are influenced by the voltage drop dur to the discharge, the residual voltage drop value memorized by the first memory means due to the residual polarization at the end of the constant load discharge, which is implemented by the battery with the predetermined large current value corresponding to the maximum supplying power value to the loads of the vehicle and is identical with the component of the voltage drop influenced on the estimated voltage, is added to the present estimated voltage of the battery so that the component of the voltage drop influenced on the estimated voltage is canceled out by the residual voltage drop value, thereby the state of charge of the battery can be accurately computed.

According to the apparatus for computing a battery capacity of the present invention, the battery is set in a state that the polarization of the discharge side large enough for canceling out the polarization arisen during the former charge and discharge arises in the battery, thereby the state of charge of the battery can be securely computed without being influenced by the polarization due to the former charge and discharge.

According to the apparatus for computing a battery capacity of the present invention, the voltage-current characteristic and the estimated voltage, in which the influence of the power supply to the loads of the vehicle except the starter motor is removed, are calculated by the first calculating means and the estimating means, respectively, from the discharge current and the terminal voltage of the battery, which purely reflects the residual component excluding the component that is canceled out due to the decrease of the discharge current and is measured for a period of time from a time when the first detecting means detects that the discharge current of the battery starts decreasing from the predetermined large current value to a time when the third detecting means detects that the discharge current decreases to the target current value, of the voltage drop due to the polarization of the discharge side arisen due to the discharge with the predetermined large current value, even if the loads of the vehicle except the starter motor are still driven, thereby the state of charge of the battery can be accurately computed.

What is claimed is:

1. A method for computing a battery capacity comprising the steps of:

periodically measuring a terminal voltage and a discharge current of a battery that supplies an electric power to loads in a vehicle;

calculating a voltage-current characteristic expressing a correlation between the terminal voltage and the discharge current;

estimating an estimated voltage that is an estimated terminal voltage of the battery in a constant load discharging state thereof from the voltage-current characteristic; and computing a charging capacity of the battery from the estimated voltage, wherein a value of the estimated voltage of the battery in the constant load discharge with a predetermined large current value is estimated from the voltage-current characteristic when the discharge current of the constant load discharging process by the battery that is in an equilibrium state is decreasing from the predetermined large current value corresponding to a maximum supplying electric power value to the loads, a difference value between the value of the estimated voltage and a value of an open circuit voltage, which estimates the value of the estimated voltage and is a terminal voltage of the battery that is in an equilibrium state before the start of the constant load discharge by using the predetermined large current value, is calculated in advance as a value of a residual voltage drop due to a residual polarization at the end of the discharge process of the battery, thereafter, whenever the battery is subjected to the constant load discharge by using the predetermined large current value, the voltage-current characteristic is calculated from the terminal voltage and the discharge current of the battery, which are periodically measured during the constant load discharge by using the predetermined large current value, a present estimated voltage of the battery is estimated from the voltage-current characteristic, and the value of the residual voltage drop is added to a value of the present estimated voltage of the battery, thereby a present charging capacity of the battery is computed.

2. The method for computing a battery capacity according to claim 1, wherein a value of the terminal voltage of the battery in an equilibrium state is measured in advance so as to set up the measured value as a value of the open circuit voltage, then, the voltage-current characteristic is calculated from the terminal voltage and the discharge current of the battery, which are periodically measured when the discharge current of the constant load discharging process is decreasing from the predetermined large current value when the buttery in an equilibrium state is subjected to the constant load discharge by using the predetermined large current value, then, the estimated voltage of the battery upon the constant load discharge by using the predetermined large current value starting from the equilibrium state is estimated from the voltage-current characteristic, and then, a value of the estimated voltage of the battery upon the constant load discharge by using the predetermined large current value starting from the equilibrium state is subtracted from the value of the set open circuit voltage, thereby the value of the residual voltage drop is calculated in advance.

3. The method for computing a battery capacity according to claim 2, wherein whenever the battery reaches an equilibrium state, the value of the open circuit voltage is newly replaced by a value of the terminal voltage of the battery, which is measured in the equilibrium state.

4. The method for computing a battery capacity according to claim 1, wherein whenever the battery is subjected to the constant load discharge by using the predetermined large current value, the voltage-current characteristic is calculated from the terminal voltage and the discharge current of the battery, which are periodically measured when the discharge current of the constant load discharging process by using the predetermined large current value is decreasing from the predetermined large current value, thereby the present estimated voltage of the battery is estimated from the voltage-current characteristic.

5. The method for computing a battery capacity according to claim 1, wherein the predetermined large current value is set to be a current value required upon starting a starter motor of the vehicle, and the voltage-current characteristic is calculated from the terminal voltage and the discharge current, which are periodically measured while the value of the discharge current decreases to a target current value that is smaller than the predetermined large current value and not less than a maximum discharge current value when loads of the vehicle except the starter motor are driven, after the value of the discharge current starts to decrease from the predetermined large current value.

6. The method for computing a battery capacity according to claim 1, wherein whenever the estimated voltage of the battery is estimated upon the constant load discharge by using the predetermined large current value, the value of the residual voltage drop is revised in response to a circumferential temperature of the battery upon the estimation of the estimated voltage and a circumferential temperature of the battery upon the calculation of the open circuit voltage, and the present charging capacity of the battery is computed from the revised value of the residual voltage drop.

7. A method for computing a battery capacity comprising the steps of:

periodically measuring a terminal voltage and a discharge current of a battery that supplies an electric power to loads in a vehicle;

calculating a voltage-current characteristic expressing a correlation between the terminal voltage and the discharge current;

estimating an estimated voltage that is an estimated terminal voltage of the battery in a constant load discharging state thereof from the voltage-current characteristic; and computing a charging capacity of the battery from the estimated voltage, wherein whenever the battery is subjected to the constant load discharge by using the predetermined large current value corresponding to a maximum supplying electric power value to the loads, the voltage-current characteristic is calculated from the terminal voltage and the discharge current of the battery, which are periodically measured when the discharge current of the constant load discharging process by using the predetermined large current value is decreasing from the predetermined large current value, thereby the present estimated voltage Vn of the battery is estimated from the voltage-current characteristic.

8. The method for computing a battery capacity according to claim 7, wherein the predetermined large current value is set to be a current value required upon starting a starter motor of the vehicle.

9. The method for computing a battery capacity according to claim 8, wherein the voltage-current characteristic is calculated from the terminal voltage and the discharge current, which are periodically measured while the value of the discharge current decreases to a target current value that is smaller than the predetermined large current value and not less than a maximum discharge current value when loads of the vehicle except the starter motor are driven.

10. An apparatus for computing a battery capacity executing the steps of:
periodically measuring a terminal voltage and a discharge current of a battery that supplies an electric power to loads in a vehicle when the battery is subjected to a constant load discharge by using a predetermined large current value corresponding to a maximum supplying electric power value to the loads;
calculating a voltage-current characteristic expressing a correlation between the terminal voltage and the discharge current;
estimating an estimated voltage that is an estimated terminal voltage of the battery in a constant load discharging state thereof from the voltage-current characteristic; and
computing a charging capacity of the battery from the estimated voltage,
wherein the apparatus comprises first memory means for memorizing a difference value as a value of a residual voltage drop due to a residual polarization at the end of the discharge process of the battery, said difference value being a difference value between a value of the estimated voltage and a value of an open circuit voltage,
in which the value of the estimated voltage of the battery in the constant load discharge with a predetermined large current value is estimated from the voltage-current characteristic when the discharge current of the constant load discharging process by the battery that is in an equilibrium state is decreasing from the predetermined large current value, and
the open circuit voltage estimates the value of the estimated voltage and is a terminal voltage of the battery that is in an equilibrium state before the start of the constant load discharge by using the predetermined large current value,
and wherein the value of the residual voltage drop memorized by the first memory means is added to the value of the estimated voltage of the battery, thereby a present charging capacity of the battery is computed.

11. The apparatus for computing a battery capacity according to claim 10, further comprising:
first detecting means for detecting a start of a decrease in the discharge current from the predetermined large current value in the constant load discharge process of the battery by using the predetermined large current value;
first calculating means for calculating the voltage-current characteristic from the periodically measured terminal voltage and the discharge current of the battery after the first detecting means detects the start of the decrease in the discharge current; and
estimating means for estimating the estimated voltage of the battery in the constant load discharge process of the battery by using the predetermined large current value, on the basis of the voltage-current characteristic calculated by the first calculating means,
wherein the value of the residual voltage drop memorized by the first memory means is added to a value of the estimated voltage of the battery estimated by the estimating means, thereby a present charging capacity of the battery is computed.

12. The apparatus for computing a battery capacity according to claim 11, further comprising:
second memory means for memorizing the value of the open circuit voltage;
judging means for judging whether the battery is in an equilibrium state or not; and
second calculating means for calculating the value of the residual voltage drop by subtracting the estimated voltage estimated by the estimating means from the value of the open circuit voltage memorized by the second memory means in the constant load discharge process of the battery, which is judged to be in an equilibrium state by the judging means, by using the predetermined large current value,
wherein the first memory means memorizes the value of the residual voltage drop calculated by the second calculating means.

13. The apparatus for computing a battery capacity according to claim 9, further comprising:
measuring means for measuring the terminal voltage of the battery, which is judged to be in an equilibrium state by the judging means; and
replacing means for replacing the value of the open circuit voltage memorized by the second memory means with a value of the terminal voltage of the battery measured by the measuring means.

14. The apparatus for computing a battery capacity according to claim 13, further comprising:
second detecting means for detecting a circumferential temperature of the battery; and
revising means for revising the value of the residual voltage drop memorized by the first memory means in response to the circumferential temperature of the battery detected by the second detecting means when the estimating means estimates the estimated voltage of the battery and the circumferential temperature of the battery detected by the second detecting means when the measuring means measures the terminal voltage of the battery,
wherein the revised value of the residual voltage drop revised by the revising means is added to the value of the estimated voltage of the battery estimated by the estimating means, thereby a present charging capacity of the battery is computed.

15. The apparatus for computing a battery capacity according to claim 11, wherein the predetermined large current value is a current value required upon a start of a starter motor of the vehicle, the apparatus further comprises third detecting means for detecting that the discharge current of the battery, which is detected by the first detecting means as to start decreasing from the predetermined large current value, decreases to a target current value not less than a maximum discharge current value when loads of the vehicle except a starter motor are driven, wherein after the first detecting means detects that the discharge current of the battery starts to decrease from the predetermined large current value, the first calculating means calculates the voltage-current characteristic from the periodically measured terminal voltage and the discharge current of the battery until the third detecting means detects that the discharge current of the battery decreases to the target current value.

16. An apparatus for computing a battery capacity executing the steps of:

periodically measuring a terminal voltage and a discharge current of a battery that supplies an electric power to loads in a vehicle when the battery is subjected to a constant load discharge by using a predetermined large current value corresponding to a maximum supplying electric power value to the loads;

calculating a voltage-current characteristic expressing a correlation between the terminal voltage and the discharge current;

estimating an estimated voltage that is an estimated terminal voltage of the battery in a constant load discharging state thereof from the voltage-current characteristic; and computing a charging capacity of the battery from the estimated voltage, wherein the apparatus comprises:

first detecting means for detecting a start of a decrease in the discharge current from the predetermined large current value in the constant load discharge process of the battery by using the predetermined large current value;

first calculating means for calculating the voltage-current characteristic from the periodically measured terminal voltage and the discharge current of the battery after the first detecting means detects the start of the decrease in the discharge current; and estimating means for estimating the estimated voltage of the battery in the constant load discharge process of the battery by using the predetermined large current value, on the basis of the voltage-current characteristic calculated by the first calculating means, thereby the charging capacity of the battery is computed by using the estimated voltage of the battery estimated by the estimating means.

17. The apparatus for computing a battery capacity according to claim 16, wherein the predetermined large current value is a current value required upon a start of a starter motor of the vehicle.

18. The apparatus for computing a battery capacity according to claim 17, further comprising third detecting means for detecting that the discharge current of the battery, for which the first detecting means detects that the discharge current starts decreasing from the predetermined large current value, decreases to a target current value not less than a maximum discharge current value when loads of the vehicle except a starter motor are driven, wherein after the first detecting means detects that the discharge current of the battery starts to decrease from the predetermined large current value, the first calculating means calculates the voltage-current characteristic from the periodically measured terminal voltage and the discharge current of the battery until the third detecting means detects that the discharge current of the battery decreases to the target current value.

* * * * *